United States Patent
Nagoya et al.

(10) Patent No.: US 6,849,385 B2
(45) Date of Patent: Feb. 1, 2005

(54) PHOTOSENSITIVE RESIN COMPOSITION, PROCESS OF FORMING PATTERNS WITH THE SAME, AND ELECTRONIC COMPONENTS

(75) Inventors: Tomohiro Nagoya, Chiba (JP); Hidekazu Matsuura, Chiba (JP); Takehiro Shimizu, Chiba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/482,702

(22) PCT Filed: Jul. 3, 2002

(86) PCT No.: PCT/JP02/06733

§ 371 (c)(1), (2), (4) Date: Jan. 2, 2004

(87) PCT Pub. No.: WO03/005127

PCT Pub. Date: Jan. 16, 2003

(65) Prior Publication Data

US 2004/0180286 A1 Sep. 16, 2004

(30) Foreign Application Priority Data

Jul. 3, 2001 (JP) .......................... 2001-202458
Jul. 3, 2001 (JP) .......................... 2001-202459
Mar. 26, 2002 (JP) .......................... 2002-085768
Mar. 26, 2002 (JP) .......................... 2002-085769

(51) Int. Cl.[7] .......................... G03F 7/028; G03F 7/038

(52) U.S. Cl. .................. 430/283.1; 430/287.1; 430/906; 430/325

(58) Field of Search .................. 430/283.1, 287.1, 430/325, 906

(56) References Cited

U.S. PATENT DOCUMENTS 5,025,088 A * 6/1991 Maeda et al. ............... 528/353
6,340,506 B1 * 1/2002 Buchecker et al. ......... 428/1.26

FOREIGN PATENT DOCUMENTS

| GB | 2216532 | * 11/1989 |
|---|---|---|
| JP | 63-318549 | 12/1988 |
| JP | 01-275633 | 11/1989 |
| JP | 03-179025 | 8/1991 |
| JP | 03-274557 | 12/1991 |
| JP | 09-146274 | 6/1997 |
| JP | 09-329893 | 12/1997 |
| JP | 10-020499 | 1/1998 |
| JP | 11-052572 | 2/1999 |
| JP | 2000-273172 | 10/2000 |
| JP | 2001-060005 | 3/2001 |

OTHER PUBLICATIONS

International Search Report dated Oct. 1, 2002, for International Application No. PCT/JP02/06733.

* cited by examiner

Primary Examiner—Richard L. Schilling
(74) Attorney, Agent, or Firm—Antonelli, Terry, Stout & Kraus, LLP

(57) ABSTRACT

There are disclosed a photosensitive resin composition comprising:

at least one photosensitive resin among a polyamide resin (A) having a repeating unit (U1) represented by general formula (I) below and a polyamideimide resin (B) having a repeating unit (U2) represented by general formula (II); and at least one photopolymerizable compound among a silane coupling agent (C) having a photopolymerizable unsaturated bond and a photopolymerizable unsaturated monomer (D) comprising a monomer (d1) having at least 5 photopolymerizable unsaturated bonds per molecule General formula (I):

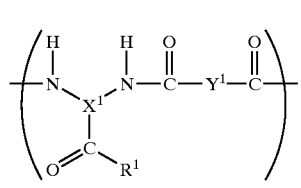 (I)

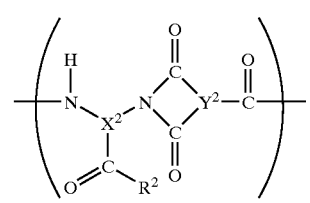 (II)

(in the formula, $X^1$ denotes a trivalent organic group having an aromatic ring, $Y^1$ denotes a divalent organic group having an aromatic ring, and $R^1$ denotes a monovalent organic group having a photosensitive group) General formula (II):

(in the formula, $X^2$ and $Y^2$ denote trivalent organic groups having an aromatic ring, and $R^2$ denotes a monovalent organic group having a photosensitive group), a pattern production process using same, and an electronic component.

33 Claims, 2 Drawing Sheets

PHOTOSENSITIVE RESIN COMPOSITION, PROCESS OF FORMING PATTERNS WITH THE SAME, AND ELECTRONIC COMPONENTS

TECHNICAL FIELD

The present invention relates to a photosensitive resin composition that has excellent heat resistance and alkali resistance, a pattern production process using same, and an electronic component.

BACKGROUND ART

In recent years, polyamide resins and polyimide resins have been used as protective films or insulating films employed in electronic components. However, a step of forming a pattern on these films comprises complicated operations such as forming a resist material film on the film surface, exposing predetermined areas, developing, removing unwanted areas by etching, etc., stripping off the resist material, and substrate surface washing. There has therefore been a desire for the development of a photosensitive material that enables a resist on which a pattern has been formed by exposure and development to be used as a protective film or an insulating film without any further treatment.

Currently, various types of photosensitive polyimide resins are being developed and widely used as protective films and insulating films employed in semiconductor devices. However, since many photosensitive polyimide resins require imidization at a temperature of approximately 300° C. subsequent to pattern formation, they cannot be applied to electronic components that cannot be subjected to a high temperature treatment. Furthermore, the alkali resistance of photosensitive polyimide resins is insufficient for them to be used as a protective film or an insulating film of special electronic components that require alkali resistance.

DISCLOSURE OF INVENTION

An object of the present invention is therefore to provide a photosensitive resin composition that can form a pattern and is suitable as a material for a protective film or an insulating film of electronic components that cannot be subjected to a high temperature treatment and electronic components that require alkali resistance; a pattern production process using same; and an electronic component.

A first aspect of the present invention provides a photosensitive resin composition comprising at least one photosensitive resin among a polyamide resin (A) having a repeating unit (U1) represented by general formula (I) below and a polyamideimide resin (B) having a repeating unit (U2) represented by general formula (II), and at least one photopolymerizable compound among a silane coupling agent (C) having a photopolymerizable unsaturated bond and a photopolymerizable unsaturated monomer (D) comprising a monomer (d1) having at least 5 photopolymerizable unsaturated bonds per molecule.

General formula (I):

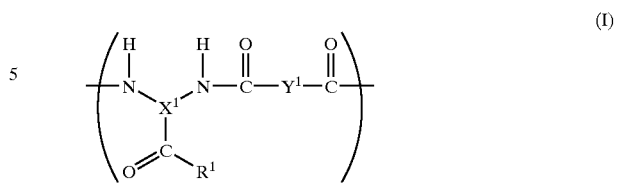

(In the formula, $X^1$ denotes a trivalent organic group having an aromatic ring, $Y^1$ denotes a divalent organic group having an aromatic ring, and $R^1$ denotes a monovalent organic group having a photosensitive group.)

General formula (II):

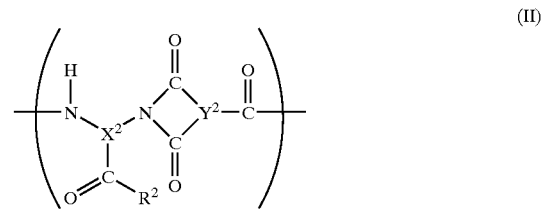

(In the formula, $X^2$ and $Y^2$ denote trivalent organic groups having an aromatic ring, and $R^2$ denotes a monovalent organic group having a photosensitive group.)

A second aspect of the present invention provides a pattern production process comprising:

laminating to a substrate a photosensitive layer comprising the photosensitive resin composition according to the present invention;

imagewise irradiating with actinic radiation so as to photocure an exposed area of the photosensitive layer; and selectively removing an unexposed area of the photosensitive layer by development so as to form a pattern.

A third aspect of the present invention provides an electronic component having a photosensitive layer comprising the photosensitive resin composition according to the present invention.

BEST MODE FOR CARRYING OUT THE INVENTION

Figure 1:
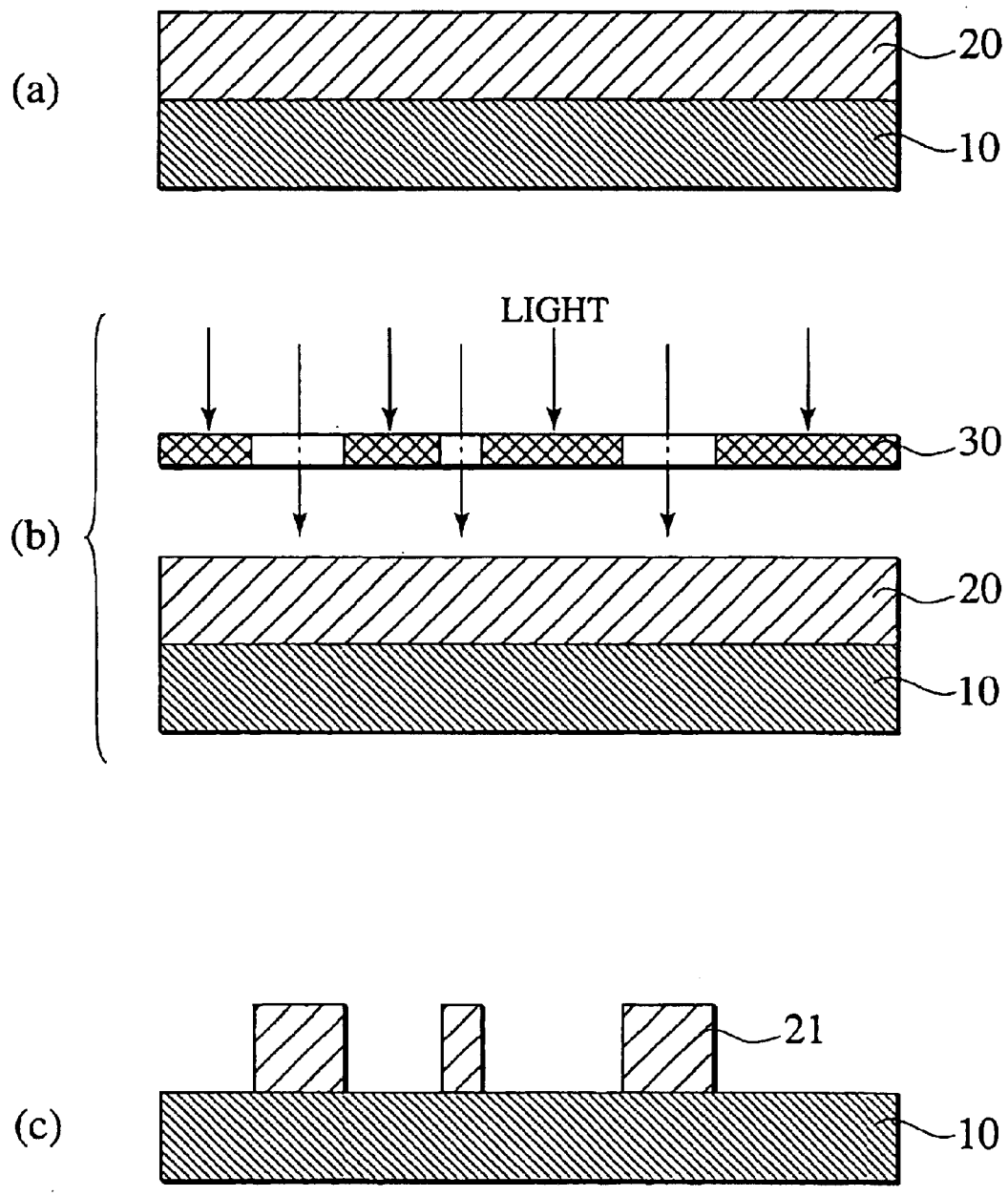
FIG. 1 is a schematic drawing showing one example of steps of the pattern production process according to the present invention.

A mode for carrying out the present invention is explained in detail below.

The photosensitive resin composition of the present invention contains the above-mentioned photosensitive resins (A) and/or (B) and the above-mentioned photopolymerizable compounds (C) and/or (D). Any combination thereof can be employed as long as at least one of (A) and (B) is contained as the photosensitive resin and at least one of (C) and (D) is contained as the photopolymerizable compound, for example, all the components (A) to (D) may be contained, or both (A) and (B) and either (C) or (D), or both (C) and (D) and either (A) or (B) may be contained.

The photosensitive resins used in the present invention are explained first. In the present invention, as the photosensitive resins, at least one of the polyamide resin (A) and the polyamideimide resin (B) shown below, or both thereof are used.

The polyamide resin (A) is a polymer having a repeating unit (U1) represented by general formula (I) below.

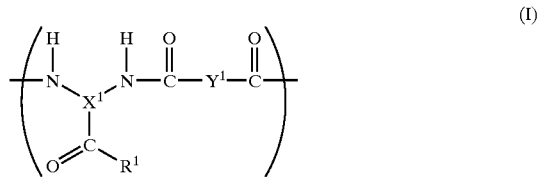

(In the formula, $X^1$ denotes a trivalent organic group having an aromatic ring, $Y^1$ denotes a divalent organic group having an aromatic ring, and $R^1$ denotes a monovalent organic group having a photosensitive group.)

In a preferred embodiment, from the viewpoint of alkali resistance, the polyamide resin (A) has in addition a repeating unit (U3) represented by general formula (III) below.

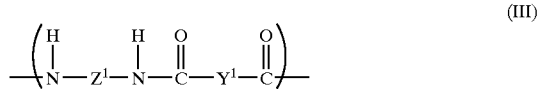

(In the formula, $Y^1$ and $Z^1$ denote divalent organic groups having an aromatic ring.)

The polyamideimide resin (B) is a polymer having a repeating unit (U2) represented by general formula (II) below.

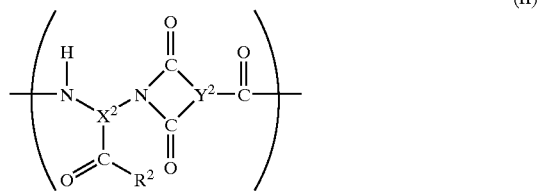

(In the formula, $X^2$ and $Y^2$ denote trivalent organic groups having an aromatic ring, and $R^2$ denotes a monovalent organic group having a photosensitive group.)

In a preferred embodiment, from the viewpoint of alkali resistance, the polyamideimide resin (B) has in addition a repeating unit (U4) represented by general formula (IV) below.

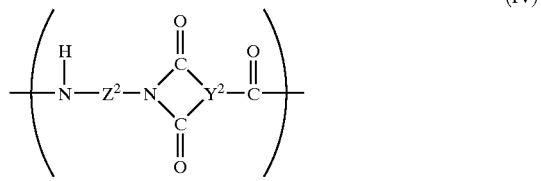

(In the formula, $Y^2$ denotes a trivalent organic group having an aromatic ring, and $Z^2$ denotes a divalent organic group having an aromatic ring.)

In the polyamide resin (A), the above-mentioned repeating unit (U1) is an essential component for imparting photosensitive properties to the resin, and in the polyamideimide resin (B), the above-mentioned repeating unit U2 is an essential component for imparting photosensitive properties to the resin; the amount of each thereof is preferably 20 to 90 mol % relative to 100 mol % of the total amount of repeating units, and more preferably 30 to 85 mol %. When the amount of either of the repeating units (U1) or U2 is less than 20 mol %, since the proportion of photosensitive groups in the resin decreases, the sensitivity is degraded and the photosensitive characteristics tend to deteriorate; on the other hand, if it is more than 90 mol %, then the reaction solution gels easily an it tends to be difficult to synthesize the resin. It is therefore preferable in the synthesis of the polyamide resin (A) and the polyamideimide resin (B), which will be described later, to use 20 to 90 mol % of an aromatic diamine represented by general formula (V) or (VI), which will be described later, and more preferably 30 to 85 mol %, relative to 100 mol % of the total amount of diamine used.

In the case where the polyamide resin (A) contains the above-mentioned repeating unit (U3), it is preferable for (U1) and (U3) to be contained at a molar ratio of (U1):(U3)=2:8 to 9:1, and more preferably 3:7 to 8.5:1.5. In the case where the polyamideimide resin (B) contains the above-mentioned repeating unit (U4), it is preferable for (U2) and (U4) to be contained at a molar ratio of (U2):(U4)=2:8 to 9:1, and more preferably 3:7 to 8.5:1.5. In the case where the proportion of (U1) in (U1)+(U3) and the proportion of (U2) in (U2)+(U4) are less than 2, since the proportion of photosensitive groups in the resins is low, the sensitivity tends to be degraded, and if it exceeds 9, gelling occurs easily and it tends to be difficult to synthesize the resins. It is therefore preferable in the synthesis of the polyamide resin (A) and the polyamideimide resin (B), which will be described later, to use the aromatic diamine represented by general formula (V) or (VI) and an aromatic diamine represented by general formula (XI) or (XII), which will be described later, at a ratio of 2:8 to 9:1, and more preferably at a ratio of 3:7 to 8.5:1.5.

$X^1$ in the above-mentioned general formula (I) is a trivalent organic group having an aromatic ring, and is generally an aromatic diamine residue that can form an amide by reacting with a dicarboxylic acid or a derivative thereof. $X^2$ in the above-mentioned general formula (II) is a trivalent organic group having an aromatic ring, and is generally an aromatic diamine residue that can form an amideimide by reacting with a tricarboxylic acid or a derivative thereof.

Examples of the aromatic ring in $X^1$ and $X^2$ include a benzene ring and a naphthalene ring, and the total number of carbons contained in each of $X^1$ and $x^2$ is preferably 6 to 40 from the viewpoint of ease of availability. Furthermore, it is preferable for the three bonding sites of each thereof to be present on the aromatic ring. Specific examples include a benzene ring, a naphthalene ring, an anthracene ring, and a group in which 2 to 6 of these aromatic rings are bonded via a single bond, an oxygen atom, a sulfur atom, a sulfonyl group, a sulfinyl group, a methylene group, a 2,2-propylene group, a carbonyl group, a dimethylsilyl group, a siloxane structure, etc. These aromatic rings may have as a substituent an alkyl group having 1 to 4 carbons.

$R^1$ in the above-mentioned general formula (I) and $R^2$ in the above-mentioned general formula (II) are monovalent organic groups having a photosensitive group, and as the photosensitive group there can be cited a group having a carbon-carbon double bond that can polymerize by light. Specific examples thereof include an allyloxy group, an acryloyloxyalkoxy group, a methacryloyloxyalkoxy group, a maleimidylalkoxy group, an acryloyloxyalkylamino group, a methacryloyloxyalkylamino group, a maleimidylalkylamino group, an allyl group, an acryloyloxyalkyl group, a methacryloyloxyalkyl group, and an ethynyl group. Preferred examples are monovalent organic groups represented by general formulae (VII) to (X) below.

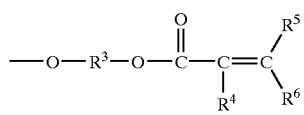
(VII)

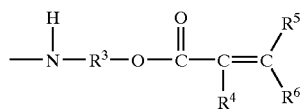
(VIII)

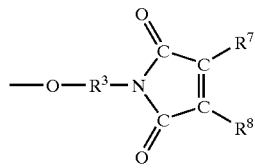
(IX)

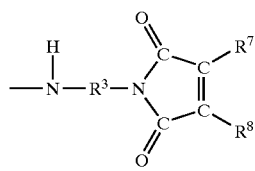
(X)

(In the formulae, $R^3$ denotes a divalent organic group, and $R^4$, $R^5$, $R^6$, $R^7$, and $R^8$ independently denote hydrogen atoms, alkyl groups having 1 to 4 carbons, phenyl groups, vinyl groups, or propenyl groups.)

From the viewpoint of heat resistance, the divalent organic group denoted by $R^3$ is preferably an alkylene group having 1 to 4 carbons, such as a methylene group, an ethylene group, or a propylene group.

In particular, among the monovalent organic groups represented by general formula (VII) or general formula (VIII), organic groups in which $R^3$ is an alkylene group having 1 to 4 carbons, $R^4$ is a hydrogen atom or a methyl group, and $R^5$ and $R^6$ are hydrogen atoms have high sensitivity and are suitably used. In particular, among the monovalent organic groups represented by general formula (IX) or general formula (X), organic groups in which $R^3$ is an alkylene group having 1 to 4 carbons and $R^7$ and $R^8$ are hydrogen atoms have high sensitivity and are suitably used.

$Y^1$ in general formula (I), $Y^1$ and $Z^1$ in general formula (III), and $Z^2$ in general formula (IV) are each divalent organic groups having an aromatic ring; examples of the aromatic ring include a benzene ring and a naphthalene ring, and the total number of carbons contained in each of $Y^1$, $Z^1$, and $Z^2$ is preferably 6 to 40 from the viewpoint of ease of availability. With regard to the polyamide resin (A), $Y^1$ in general formula (I) and $Y^1$ in general formula (III) may be identical to or different from each other. Both of the two bonding sites in $Y^1$, $Z^1$ and $Z^2$ are preferably present on the aromatic rings. Specific examples include a benzene ring, a naphthalene ring, an anthracene ring, and a group in which 2 to 6 of these aromatic rings are bonded via a single bond, an oxygen atom, a sulfur atom, a sulfonyl group, a sulfinyl group, a methylene group, a 2,2-propylene group, a carbonyl group, a dimethylsilyl group, a siloxane structure, an amide bond, etc. These aromatic rings may have as a substituent an alkyl group having 1 to 4 carbons.

$Y^2$ in general formulae (II) and (IV) is a trivalent organic group having an aromatic ring; examples of the aromatic ring include a benzene ring and a naphthalene ring, and the total number of carbons contained in $Y^2$ is preferably 6 to 40 from the viewpoint of ease of availability. With regard to the polyamideimide resin (B), $Y^2$ in general formula (II) and $Y^2$ in general formula (IV) may be identical to or different from each other. All of the three bonding sites in $Y^2$ are preferably present on the aromatic ring. Specific examples of the aromatic ring denoted by $Y^2$ are the same as those cited as examples for the above-mentioned $Y^1$, $Z^1$, and $Z^2$.

The polyamide resin (A) having the above-mentioned repeating unit (U1), and preferably in addition (U3), can be preferably synthesized by, for example, a method in which an aromatic diamine and an aromatic dicarboxylic acid or a reactive derivative thereof are reacted to form an amide. The reactive derivative of the aromatic dicarboxylic acid means a dihalide such as, for example, a dichloride or dibromide of the aromatic dicarboxylic acid, a diester thereof, etc. The total amount of aromatic diamine used is preferably 80 to 120 mol % relative to 100 mol % of the total amount of aromatic dicarboxylic acid or reactive derivative thereof, and more preferably 95 to 105 mol %. If the total amount of diamine is less than 80 mol % or more than 120 mol %, then the molecular weight of the polyamide resin (A) obtained is low, and its alkali resistance and chemical resistance tend to be poor.

Specifically, the polyamide resin (A) can be synthesized by reacting an acid component comprising an aromatic dicarboxylic acid or a reactive derivative thereof with a base component comprising an aromatic diamine represented by general formula (V).

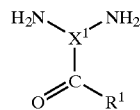
(V)

(In the formula, $X^1$ and $R^1$ are the same as $X^1$ and $R^1$ in the above-mentioned general formula (I).)

The polyamideimide resin (B) having the above-mentioned repeating unit (U2), and preferably in addition (U4), can preferably be obtained by, for example, reacting an acid component comprising an aromatic tricarboxylic acid anhydride or a reactive derivative thereof with a base component comprising an aromatic diamine represented by general formula (VI) below, so as to form an amideimide.

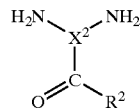
(VI)

(In the formula, $X^2$ and $R^2$ are the same as $X^2$ and $R^2$ in the above-mentioned general formula (II).) The reactive derivative of the aromatic tricarboxylic acid anhydride referred to means a halide such as, for example, a chloride or bromide of the aromatic tricarboxylic acid anhydride, an ester thereof, etc., and trimellitic anhydride chloride, etc. can be preferably used. The total amount of base component used is preferably 80 to 120 mol % relative to 100 mol % of the acid component from the viewpoint of the molecular weight of the resin obtained and its alkali resistance and chemical resistance, and more preferably 95 to 105 mol %.

With regard to the diamines of general formulae (V) and (VI), specific examples are listed below,

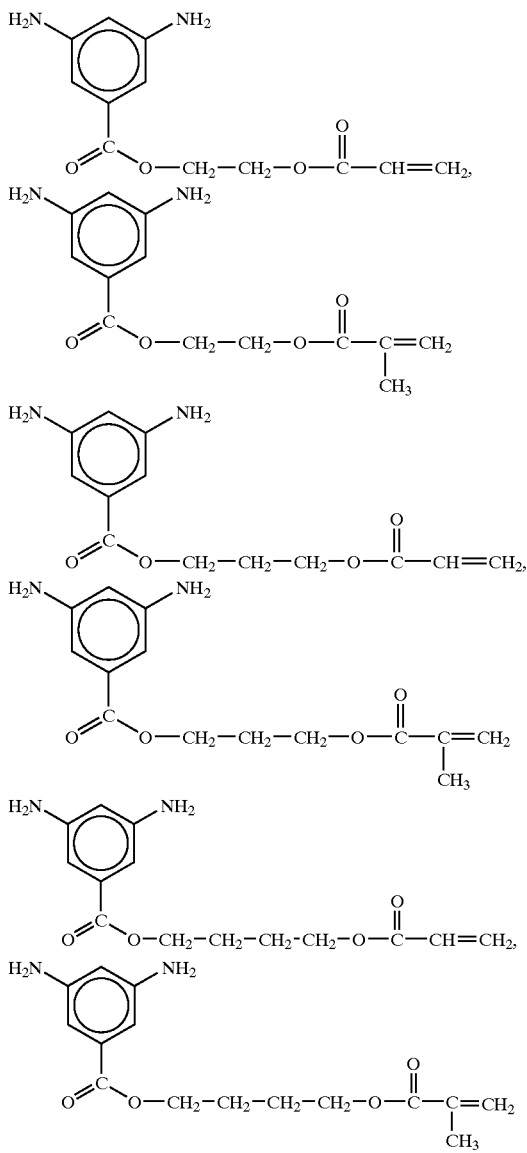

and these can be suitably used. The repeating units (U1) or (U3) may be synthesized using two or more types of these diamines.

Other than the diamine represented by the above-mentioned formula (V), with regard to the aromatic diamine that is preferably used as the base component that is a starting material for the synthesis of the polyamide resin (A), there can be cited a diamine represented by general formula (XI) below:

(In the formula, $Z^1$ is the same as $Z^1$ in the above-mentioned general formula (III).) The polyamide resin (A) having the above-mentioned repeating unit (U3) can preferably be synthesized by the combined use of the diamine of general formula (XI).

Other than the diamine represented by the above-mentioned formula (VI), with regard to the aromatic diamine that is preferably used as the base component that is a starting material for the synthesis of the polyamideimide resin (B), there can be cited a diamine represented by general formula (XII) below:

(In the formula, $Z^2$ is the same as $Z^2$ in the above-mentioned general formula (IV).) The polyamideimide resin (B) having the above-mentioned repeating unit (U4) can preferably be synthesized by the combined use of the diamine of general formula (XII).

Examples of the diamines of general formulae (XI) and (XII) include phenylenediamine, tolylenediamine, xylylenediamine, naphthalenediamine, 4,4'-diaminodiphenylmethane, 4,4'-diaminodiphenylsulfone, 4,4'-diaminodiphenyl ether, 4,4'-diaminobenzanilide, 4,4'-diaminobenzophenone, 3,3'-diaminodiphenylsulfone, 3,3',5,5'-tetramethyl-4,4'-diaminodiphenylmethane, 3,3',5,5'-tetraisopropyl-4,4'-diaminodiphenylmethane, 1,4-bis(4-aminocumyl)benzene, 1,3-bis(4-aminocumyl)benzene, 1,4-bis(4-aminophenoxy)benzene, 1,4-bis(3-aminophenoxy)benzene, 1,3-bis(3-aminophenoxy)benzene, 2,2-bis[4-(4-aminophenoxy)phenyl]propane, 2,2-bis[4-(3-aminophenoxy)phenyl]propane, bis[4-(4-aminophenoxy)phenyl]sulfone, bis[4-(3-aminophenoxy)phenyl]sulfone, bis[4-(4-aminophenoxy)phenyl]ether, and bis[4-(4-aminophenoxy)phenyl]biphenyl. The repeating units (U3) or (U4) may be synthesized using two or more types of these diamines.

With regard to the aromatic dicarboxylic acid that is reacted with the above-mentioned aromatic diamine in the synthesis of the polyamide resin (A), a dicarboxylic acid represented by general formula (XIII) below can be used.

(In the formula, $Y^1$ is the same as $Y^1$ in the above-mentioned general formulae (I) and (III).)

Examples of the dicarboxylic acid of general formula (XIII) include terephthalic acid, isophthalic acid, bis(4-carboxyphenyl)ether, bis(4-carboxyphenyl)sulfone, 4,4'-biphenyldicarboxylic acid, and 1,5-naphthalenedicarboxylic acid, and they may be used in a combination of two or more types. Among these, terephthalic acid and isophthalic acid are preferable from the viewpoint of ease of availability and low cost. In particular, use of a mixture of terephthalic acid and isophthalic acid is preferable from the viewpoint of the solubility of the polyamide resin formed.

With regard to the aromatic tricarboxylic acid anhydride that is reacted with the above-mentioned aromatic diamine in the synthesis of the polyamideimide resin (B), one represented by general formula (XIV) below having an acid anhydride group that can react with an amino group to form an imide group can preferably be used.

(In the formula, $Y^2$ is the same as $Y^2$ in the above-mentioned general formulae (II) and (IV).)

From the viewpoint of heat resistance and economy, trimellitic anhydride can preferably be used. Two or more types of aromatic tricarboxylic acid anhydrides may also be used.

The above-mentioned acid component may contain, in addition to the above-mentioned aromatic tricarboxylic acid anhydride, an aromatic dicarboxylic acid or an aromatic tetracarboxylic acid dianhydride. Examples of the aromatic dicarboxylic acid include terephthalic acid, isophthalic acid, bis(4-carboxyphenyl) ether, bis(4-carboxyphenyl)sulfone, 4,4'-biphenyldicarboxylic acid, and 1,5-naphthalenedicarboxylic acid, and they may be used in a combination of two or more types. These dicarboxylic acids can also be used as a reactive derivative such as an ester or a halide.

Examples of the aromatic tetracarboxylic acid dianhydride include pyromellitic dianhydride, 3,3',4,4'-benzophenonetetracarboxylic dianhydride, 3,3',4,4'-biphenyltetracarboxylic dianhydride, hexafluoroisopropylidene 2,2-bisphthalic dianhydride, bis(3,4-dicarboxyphenyl)sulfone dianhydride, 4,4'-bis(3,4-dicarboxyphenoxy)diphenylsulfone dianhydride, 2,2-bis[4-(3,4-dicarboxyphenoxy)phenyl]propane dianhydride, ethylene glycol bistrimellitate dianhydride, decamethylene glycol bistrimellitate dianhydride, bisphenol A bistrimellitate dianhydride, 2,2-bis[4-(3,4-dicarboxyphenylbenzoyloxy)phenyl]hexafluoropropane dianhydride, and 4,4'-[1,4-phenylenebis(1-methylethylidene)]bisphenylbistrimellitate dianhydride, and they may be used in a combination of two or more types. These tetracarboxylic acid dianhydrides can also be used in the form of a free acid (a tetracarboxylic acid) or a derivative such as an ester or a halide.

The synthetic methods and the reaction conditions for the polyamide resin (A) and the polyamideimide resin (B) are not particularly limited, and a standard method can be employed. In the case of the polyamide resin (A), a polyamide resin can be obtained by reacting the above-mentioned acid component and the base component in a polar solvent at 80° C. or below. In the case where the acid component is a dicarboxylic acid, it is preferable to use as a dehydrating agent an acid anhydride such as acetic anhydride, propionic anhydride, or benzoic anhydride, or a carbodiimide compound such as dicyclohexylcarbodiimide. During this process, a dehydration catalyst such as pyridine, isoquinoline, trimethylamine, aminopyridine, or imidazole may be used as necessary. The dehydrating agent and the dehydration catalyst are each preferably used in the range of 1 to 8 moles per mole of the dicarboxylic acid. In the case where the acid component is a halide, an acid scavenger such as triethylamine or propylene oxide is preferably added. The acid scavenger is preferably used in the range of 1 to 8 moles per mole of the acid component. In the case of the polyamideimide resin (B), the above-mentioned acid component and the base component are reacted in a polar solvent at 80° C. or below, and the amide acid thus formed is subjected to dehydrative ring-closure to give a polyamideimide resin. The dehydrative ring-closure can be carried out by a method (thermal imidization) involving a thermal treatment at 120° C. to 250° C. or a method (chemical imidization) in which a dehydrating agent is used. In the case where the method involving thermal treatment at 120° C. to 250° C. is employed, it is preferable to carry out the treatment while removing from the system the water formed by the dehydration reaction. During this process, the water may be removed azeotropically using benzene, toluene, xylene, etc. The method in which dehydrative ring-closure is carried out using a dehydrating agent preferably employs as the dehydrating agent an acid anhydride such as acetic anhydride, propionic anhydride, or benzoic anhydride, or a carbodiimide compound such as dicyclohexylcarbodiimide. During this process, a dehydration catalyst such as pyridine, isoquinoline, trimethylamine, aminopyridine, or imidazole may be used as necessary. The dehydrating agent and the dehydration catalyst are each preferably used in the range of 1 to 8 moles per mole of tricarboxylic acid having an acid anhydride group.

When the polyamide resin (A) or the polyamideimide resin (B) is synthesized, in order to prevent a dark reaction of the photosensitive group, a radical polymerization inhibitor or a radical polymerization retarder can be added. Examples of the radical polymerization inhibitor or radical polymerization retarder include p-methoxyphenol, diphenyl-p-benzoquinone, benzoquinone, 2,2'-methylenebis(4-ethyl-6-t-butylphenol), 6-t-butyl-2,3-xylenol, pyrogallol, phenothiazine, resorcinol, o-dinitrobenzene, p-dinitrobenzene, m-dinitrobenzene, phenanthraquinone, N-phenyl-1-naphthylamine, N-phenyl-2-naphthylamine, cupferron, tannic acid, p-benzylaminophenol, vitamin E, and nitrosamines. They can be used singly or in a combination of two or more types. The amount of the radical polymerization inhibitor or radical polymerization retarder used is preferably 0.01 to 20 mol % relative to 100 mol % of the total amount of diamine represented by general formula (V) or (VI), and more preferably 0.05 to 10 mol %. When it is less than 0.01 mol %, the reaction solution tends to gel, and when it is more than 20 mol %, the sensitivity tends to be degraded.

With regard to an organic solvent that is used when the polyamide resin (A) and the polyamideimide resin (B) are synthesized, a polar solvent that completely dissolves the resins so formed is preferable, and examples thereof include N-methyl-2-pyrrolidone, N,N-dimethylacetamide, N,N-dimethylformamide, dimethylsulfoxide, γ-butyrolactone, and sulfolane. Other than these polar solvents, ketones, esters, ethers, aliphatic compounds, aromatic compounds, halides thereof, etc. can also be used, and examples thereof include acetone, diethyl ketone, methyl ethyl ketone, methyl isobutyl ketone, cyclohexanone, ethyl acetate, butyl acetate, diethyl ether, ethylene glycol dimethyl ether, diethylene glycol dimethyl ether, tetrahydrofuran, dichloromethane, 1,2-dichloroethane, chlorobenzene, hexane, heptane, octane, toluene, and xylene. These organic solvents may be used singly or in a combination of two or more types.

The polyamide resin (A) and the polyamideimide resin (B) thus obtained may be used for forming a coating (a photosensitive layer) without further treating the reaction solution, or may be used after purification by pouring the reaction solution into a poor solvent so as to precipitate the resin.

The polyamide resin (A) and the polyamideimide resin (B) used in the present invention preferably have a weight average molecular weight of 8,000 to 200,000 from the viewpoint of the heat resistance, chemical resistance, and developability of unexposed areas, and more preferably 10,000 to 180,000. If the weight average molecular weight is less than 8,000, then the heat resistance and the chemical resistance tend to be degraded, and if it is more than 200,000, the developability of unexposed areas is degraded, and a development residue easily forms. The weight average molecular weight can be measured by gel permeation chromatography and calculated using polystyrene as a standard.

The photopolymerizable compound used in the present invention is now explained. In the present invention, as the photopolymerizable compound there is used at least one or both of the silane coupling agent (C) having a photopolymerizable unsaturated bond and the photopolymerizable unsaturated monomer (D) comprising the monomer (d1) having at least 5 photopolymerizable unsaturated bonds per molecule.

The silane coupling agent (C) having a photopolymerizable unsaturated bond is used in order to improve the alkali resistance of the photosensitive resin composition. When this silane coupling agent (C) is selected as the photopolymerizable compound, the amount thereof added is preferably 0.1 to 20 parts by weight, and more preferably 1 to 15 parts by weight, relative to 100 parts by weight of the total amount of photosensitive resin (the total amount of the photosensitive resins comprising the polyamide resin (A) and/or the polyamideimide resin (B); the same applies below). If it is less than 0.1 parts by weight, then there is a tendency that the substrate adhesion and the cross-linking density are degraded and the alkali resistance and the chemical resistance are degraded. On the other hand, if it is more than 20 parts by weight, then there is a tendency that gelation occurs easily due to a dark reaction and the storage stability is degraded.

Examples of the silane coupling agent (C) include vinyltriethoxysilane, vinyltrimethoxysilane, vinyltriacetoxylsilane, vinyltris(2-methoxyethoxy)silane, vinyltrichlorosilane, vinylsilyl triisocyanate, 3-methacryloyloxypropyltrimethoxysilane, 3-methacryloyloxypropyldimethoxymethylsilane, 3-methacryloyloxypropyltrimethoxysilane, and tris(methacryloyloxyethoxy)methylsilane. These silane coupling agents (C) may be used singly or in a combination of two or more types.

In a preferred embodiment, in order to improve the adhesion to a substrate, a coupling agent other than the above-mentioned silane coupling agent (C) can be added together with the above-mentioned silane coupling agent (C), or by itself (corresponding to a case in which only (D) is selected as the photopolymerizable compound, and (C) is not included). The amount of the coupling agent other than (C) added is preferably 0.1 to 15 parts by weight, and preferably 0.3 to 10 parts by weight, relative to 100 parts by weight of the total amount of photosensitive resin. With regard to such a coupling agent other than the above-mentioned (C), a silane coupling agent (that is, a silane coupling agent having no photopolymerizable unsaturated bond) is preferable, and examples thereof include γ-glycidoxypropyltrimethoxysilane, γ-mercaptopropyltrimethoxysilane, γ-aminopropyltriethoxysilane, γ-ureidopropyltriethoxysilane, and N-β-aminoethyl-γ-aminopropyltrimethoxysilane.

As the photopolymerizable unsaturated monomer (D), the monomer (d1) having at least 5 photopolymerizable unsaturated bonds per molecule is used. This can improve the photosensitive characteristics of the photosensitive resin composition and can greatly improve the solvent resistance and, in particular, the alkali resistance. From the viewpoint of the cross-linking density and the alkali resistance, the monomer (d1) is preferably contained at 30 wt % or more relative to 100 wt % of the photopolymerizable unsaturated monomer (D), that is, 30 to 100 wt %, and more preferably 50 to 100 wt %.

With regard to a photopolymerizable unsaturated monomer other than the above-mentioned monomer (d1), a monomer (d2) having 2 to 4 photopolymerizable unsaturated bonds per molecule is preferably used from the viewpoint of the photosensitive characteristics, etc. In the case where the monomer (d1) is used as the photopolymerizable compound, this monomer (d2) is used together with (d1), whereas in the case where the monomer (d1) is not used (corresponding to a case in which the above-mentioned silane coupling agent (C) is selected as the photopolymerizable compound), the monomer (d2) is preferably used together with the silane coupling agent (C).

In the case where the photopolymerizable unsaturated monomer (D) comprising the monomer (d1) is selected as the photopolymerizable compound, the amount of (D) added (that is, the total amount of photopolymerizable unsaturated monomer comprising the monomer (d1) and, in some cases, the monomer (d2)) is preferably at least 1 part by weight relative to 100 parts by weight of the total amount of photosensitive resin from the viewpoint of sensitivity improvement, preferably at most 500 parts by weight from the viewpoint of storage stability, and more preferably 3 to 300 parts by weight. This preferred amount of the photopolymerizable unsaturated monomer (D) added can also be applied to a case in which the monomer (d1) is not used and a photopolymerizable unsaturated monomer (such as the monomer (d2)) other than the monomer (d1) is used. For example, in the case where only the silane coupling agent (C) is included as the photopolymerizable compound, the amount of the monomer (d2) added is preferably 1 to 500 parts by weight, and more preferably 3 to 300 parts by weight, relative to 100 parts by weight of the total amount of photosensitive resin.

With regard to the monomer (d1), it is preferable to use a monomer having at least 5 acryloyl or methacryloyl groups per molecule, but the monomer (d1) is not limited thereto. Particularly preferred examples thereof include dipentaerythritol pentaacrylate, dipentaerythritol hexaacrylate, a hexaacrylate and a hexamethacrylate having a phosphazene skeleton, represented by general formula (XV):

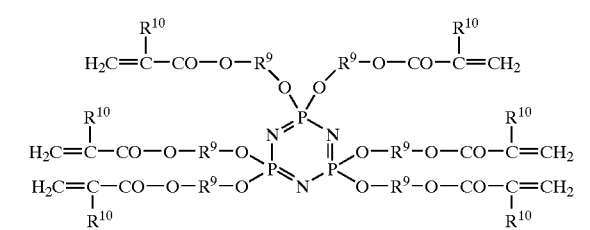

(in the formula, the six $R^9$s independently denote alkylene groups having 1 to 5 carbons, and the six $R^{10}$s independently denote methyl groups or hydrogen atoms), a hexaacrylate, a hexamethacrylate, a pentaacrylate, and a pentamethacrylate of a lactone-modified product of dipentaerythritol, represented by general formula (XVI):

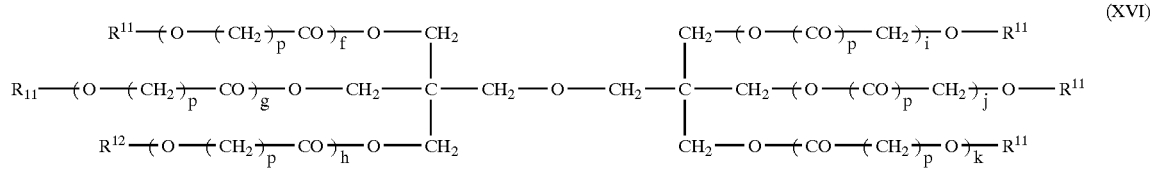

(in the formula, the five $R^{11}$s independently denote acryloyl groups or methacryloyl groups, $R^{12}$ denotes an acryloyl group, a methacryloyl group, or a hydrogen atom, p denotes an integer of 3 to 10, and f, g, h, i, j, and k independently denote integers of 0 to 5), and a hexaacrylate, a hexamethacrylate, a pentaacrylate, and a pentamethacrylate of an alkylene oxide adduct of dipentaerythritol, represented by general formula (XVII):

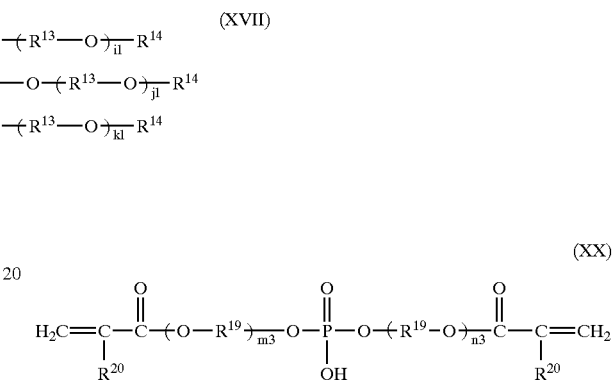

(XVII)

(in the formula, the plurality of $R^{13}$s independently denote ethylene groups or propylene groups, the five $R^{14}$s independently denote acryloyl groups or methacryloyl groups, $R^{15}$ denotes an acryloyl group, a methacryloyl group, or a hydrogen atom, and f1, g1, h1, i1, j1, and k1 independently denote integers of 0 to 5). These monomers may be used singly or in a combination of two or more types.

The monomer (d2) is not particularly restricted, and examples thereof include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, divinylbenzene, 1,3-acryloyloxy-2-hydroxypropane, 1,3-methacryloyloxy-2-hydroxypropane, methylenebisacrylamide, glycerol dimethacrylate, neopentylglycol diacrylate, polyethylene glycol diacrylate, polyethylene glycol dimethacrylate, polypropylene glycol diacrylate, polypropylene glycol dimethacrylate, tris(methacryloxyethyl) isocyanurate, a diacrylate and a dimethacrylate of an alkylene oxide adduct of bisphenol A, represented by general formula (XVIII):

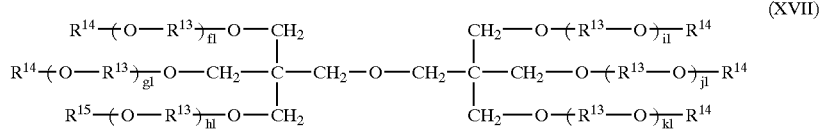

(XVIII)

(in the formula, the plurality of $R^{16}$s independently denote ethylene groups or propylene groups, the two $R^{17}$s independently denote methyl groups or hydrogen atoms, and m1 and n1 independently denote integers of 1 to 20), a diacrylate and a dimethacrylate of an epichlorohydrin-modified product of bisphenol A, represented by general formula (XIX):

(in the formula, the two $R^{18}$s independently denote methyl groups or hydrogen atoms, and m2 and n2 independently denote integers of 1 to 10), bisphenol A dimethacrylate, bisphenol A diacrylate, a diacrylate and a dimethacrylate of an alkylene oxide adduct of phosphoric acid, represented by general formula (XX):

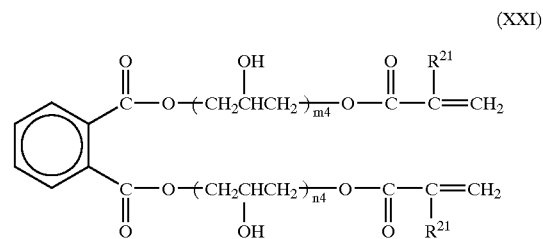

(XX)

(in the formula, the plurality of $R^{19}$s independently denote ethylene groups or propylene groups, the two $R^{20}$s independently denote methyl groups or hydrogen atoms, and m3 and n3 independently denote integers of 1 to 20), a diacrylate and a dimethacrylate of an epichlorohydrin-modified product of phthalic acid, represented by general formula (XXI):

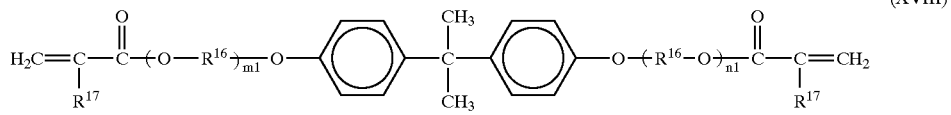

(XXI)

(in the formula, the two $R^{21}$s independently denote methyl groups or hydrogen atoms, and m4 and n4 independently denote integers of 1 to 10), a diacrylate and a dimethacrylate of an epichlorohydrin-modified product of 1,6-hexanediol, represented by general formula (XXII):

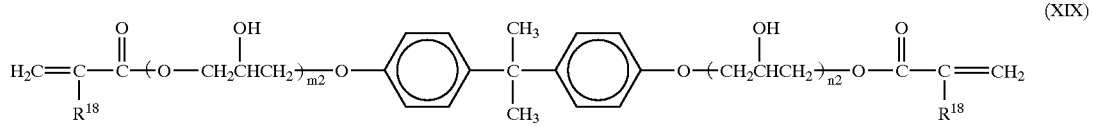

(XIX)

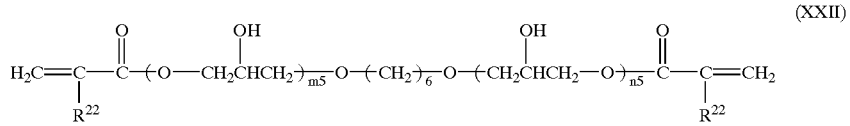

(in the formula, the two $R^{22}$s independently denote methyl groups or hydrogen atoms, and m5 and n5 independently denote integers of 1 to 20), a triacrylate and a trimethacrylate of an alkylene oxide adduct of phosphoric acid, represented by general formula (XXIII):

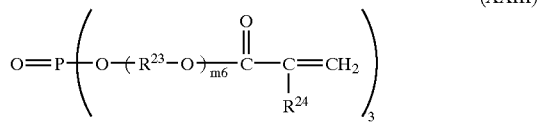

(in the formula, the plurality of $R^{23}$s independently denote ethylene groups or propylene -groups, the three $R^{24}$s independently denote methyl groups or hydrogen atoms, and the three m6s independently denote integers of 1 to 20), a triacrylate and a trimethacrylate of an alkylene oxide adduct of trimethylolpropane, represented by general formula (XXIV):

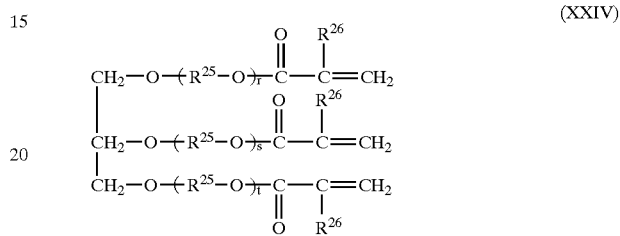

(in the formula, the plurality of $R^{25}$s independently denote ethylene groups or propylene groups, the three $R^{26}$s independently denote methyl groups or hydrogen atoms, and r, s, and t independently denote integers of 1 to 20), a bismaleimide of an alkylene oxide adduct of bisphenol A, represented by general formula (XXV):

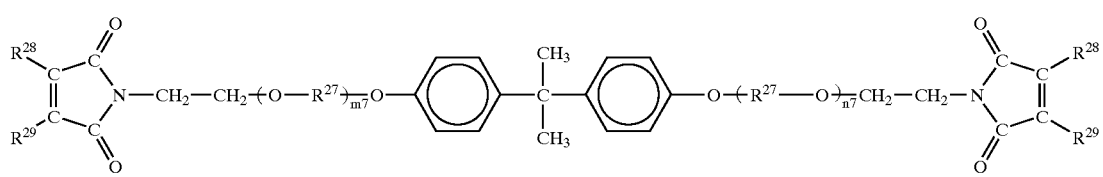

(in the formula, the plurality of $R^{27}$s independently denote ethylene groups or propylene groups, the two $R^{28}$ and the two $R^{29}$s independently denote hydrogen atoms, alkyl groups having 1 to 4 carbons, phenyl groups, vinyl groups, or propenyl groups, and m7 and n7 independently denote integers of 1 to 20), a bismaleimide of an epichlorohydrin-modified product of bisphenol A, represented by general formula (XXVI):

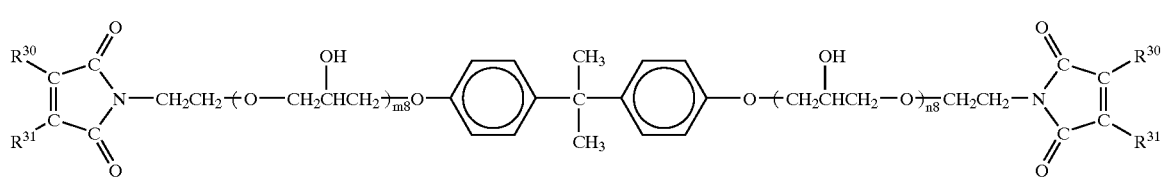

(in the formula, the two $R^{30}$s and the two $R^{31}$s independently denote hydrogen atoms, alkyl groups having 1 to 4 carbons, phenyl groups, vinyl groups, or propenyl groups, and m8 and n8 independently denote integers of 1 to 10), a bismaleimide of an alkanediol, represented by general formula (XXVII):

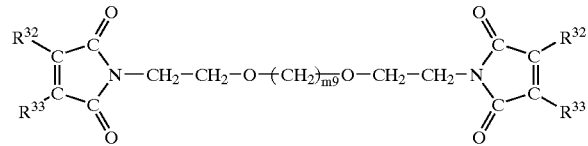

(in the formula, the two $R^{32}$s and the two $R^{33}$s independently denote hydrogen atoms, alkyl groups having 1 to 4 carbons, phenyl groups, vinyl groups, or propenyl groups, and m9 denotes an integer of 2 to 20), a bismaleimide of an epichlorohydrin-modified product of 1,6-hexanediol, represented by general formula (XXVIII):

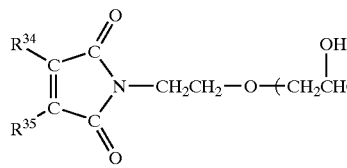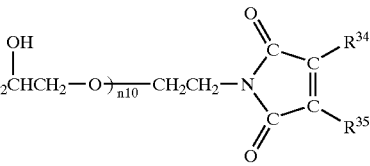

(in the formula, the two $R^{34}$s and the two $R^{35}$s independently denote hydrogen atoms, alkyl groups having 1 to 4 carbons, phenyl groups, vinyl groups, or propenyl groups, and m10 and n10 independently denote integers of 1 to 20), and 2,2-bis(p-maleimidylphenoxyphenyl)propane. These monomers may be used singly or in a combination of two or more types.

In addition to the components (A), (B), (C), and (D) explained above, the photosensitive resin composition according to the present invention preferably contains a photopolymerization initiator (E). The amount of this photopolymerization initiator (E) added is preferably at least 1 part by weight relative to 100 parts by weight of the total amount of photosensitive resin from the viewpoint of sensitivity and pattern formation properties, preferably at most 80 parts by weight from the viewpoint of adhesion, more preferably 3 to 70 parts by weight, and yet more preferably 3 to 50 parts by weight.

The above-mentioned photopolymerization initiator (E) is not particularly restricted, and examples thereof include benzophenone, N,N'-tetraethyl-4,4'-diaminobenzophenone, 4-methoxy-4'-dimethylaminobenzophenone, benzil, 2,2-diethoxyacetophenone, benzoin, benzoin methyl ether, benzoin isobutyl ether, benzyl dimethyl ketal, α-hydroxyisobutylphenone, thioxanthone, 2-chlorothioxanthone, 1-hydroxycyclohexyl phenyl ketone, 2-methyl-1-[4-(methylthio)phenyl]-2-morpholino-1-propane, t-butylanthraquinone, 1-chloroanthraquinone, 2,3-dichloroanthraquinone, 3-chloro-2-methylanthraquinone, 2-ethylanthraquinone, 1,4-naphthoquinone, 9,10-phenanthraquinone, 1,2-benzoanthraquinone, 1,4-dimethylanthraquinone, 2-phenylanthraquinone, and 2-(o-chlorophenyl)-4,5-diphenylimidazole dimer. These photopolymerization initiators may be used singly or in a combination of two or more types.

In a preferred embodiment, the photosensitive resin composition according to the present invention may further contain a solvent. This solvent is not particularly restricted, and there can be cited as examples organic solvents including ketone compounds such as acetone, methyl ethyl ketone, cyclopentanone, and cyclohexanone; alkylene glycol ether compounds such as methyl cellosolve, ethyl cellosolve, butyl cellosolve, methyl cellosolve acetate, ethyl cellosolve acetate, butyl cellosolve acetate, 3-methyl-3-methoxybutyl acetate, ethylene glycol monopropyl ether, ethylene glycol monohexyl ether, ethylene glycol dimethyl ether, diethylene glycol ethyl ether, diethylene glycol dimethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol dimethyl ether, triethylene glycol methyl ether acetate, triethylene glycol ethyl ether acetate, triethylene glycol propyl ether acetate, triethylene glycol isopropyl ether acetate, triethylene glycol butyl ether acetate, and triethylene glycol t-butyl ether acetate; alcohol compounds such as methanol, ethanol, propyl alcohol, and butyl alcohol; aliphatic compounds such as hexane, heptane, and octane; halides of aliphatic/aromatic compounds such as chloroform, dichloromethane, 1,2-dichloroethane, and chlorobenzene; ester compounds such as ethyl acetate and butyl acetate; ether compounds such as ethyl ether, tetrahydrofuran, and dioxane; aromatic compounds such as benzene, toluene, and xylene; amide compounds such as N,N-dimethylacetamide, N,N-dimethylformamide, and N-hydroxymethyl-2-pyrrolidone; and aprotic polar solvents such as γ-butyrolactone, N-methyl-2-pyrrolidone, sulfolane, and dimethyl sulfoxide. These organic solvents may be used singly or in a combination of two or more types. The amount of these organic solvents added is not particularly restricted, and it is usually preferably 50 to 5000 parts by weight relative to 100 parts by weight of the total amount of photosensitive resin.

In a preferred embodiment, in order to improve the storage stability, a radical polymerization inhibitor or a radical polymerization retarder may be added to the photosensitive resin composition according to the present invention. Examples of the radical polymerization inhibitor or radical polymerization retarder include p-methoxyphenol, diphenyl-p-benzoquinone, benzoquinone, 2,2'-methylenebis (4-ethyl-6-t-butylphenol), 6-t-butyl-2,3-xylenol, pyrogallol, phenothiazine, resorcinol, o-dinitrobenzene, p-dinitrobenzene, m-dinitrobenzene, phenanthraquinone, N-phenyl-1-naphthylamine, N-phenyl-2-naphthylamine, cupferron, tannic acid, p-benzylaminophenol, vitamin E, and nitrosamines. They can be used singly or in a combination of two or more types.

The amount of radical polymerization inhibitor or radical polymerization retarder used is preferably at least 0.01 parts by weight from the viewpoint of the stability of the photosensitive resin composition, preferably at most 30 parts by weight from the viewpoint of the sensitivity, and more preferably 0.05 to 10 parts by weight, relative to 100 parts by weight of the total amount of the photosensitive resin comprising the components (A) and/or (B) and the photopolymerizable compound comprising the components (C) and/or (D).

In addition to the above, the photosensitive resin composition of the present invention can contain, in order to further improve various characteristics such as adhesion and coating hardness, at least one type of known inorganic filler such as barium sulfate, barium titanate, silica, talc, calcined kaolin, magnesium carbonate, aluminum oxide, aluminum hydroxide, and mica, as necessary, and the amount thereof added is preferably 0.1 to 80 parts by weight relative to 100 parts by weight of the total amount of the photosensitive resin composition, and more preferably 0.5 to 50 parts by weight. Furthermore, various types of known standard additives including a known coloring agent such as phthalocyanine blue, phthalocyanine green, iodine green, disazo yellow, crystal violet, titanium oxide, carbon black, or naphthalene black; a viscosity increasing agent such as bentonite or montmorillonite; and an antifoaming agent such as a silicone type, a fluorine type, or a vinyl resin type can be used as necessary. They can be used singly or in a combination of two or more types.

The photosensitive resin composition according to the present invention can be obtained by, for example, uniformly kneading and mixing the above-mentioned components by means of a roll mill, a bead mill, etc., and by applying the composition thus obtained on a substrate such as a silicon wafer, a metal substrate, or a ceramic substrate by a method such as a dipping method, a spray method, a screen printing method, or a spin-coating method, and removing the solvent by heating, a coating comprising the non-volatile components of the photosensitive resin composition of the present invention can be formed. The heating to remove the solvent is preferably carried out at 60° C. to 150° C. The thickness of this coating is not particularly limited, but it is preferably 1 to 50 $\mu$m from the viewpoint of the developability, etc., more preferably 2 to 40 $\mu$m, and particularly preferably 2 to 30 $\mu$m.

The pattern production process according to the present invention is now explained by reference to FIG. 1, which schematically illustrates one example of the steps thereof.

In a step (i), as shown in FIG. 1(a), a photosensitive layer (coating) 20 comprising the photosensitive resin composition according to the present invention described above is laminated on a substrate 10 such as a flexible printed wiring board. The lamination can be carried out by any method, but it can be preferably carried out by applying by the dipping method, the spray method, the screen printing method, the spin-coating method, etc., and removing the solvent.

After lamination of the photosensitive layer 20 is completed, in a step (ii) it is imagewise irradiated with actinic radiation so as to photocure exposed areas of the photosensitive layer (that is, the photosensitive layer of the exposed portions). The actinic radiation referred to here means electromagnetic waves and particle beams such as ultraviolet rays, X-rays, electron beams, radioactive radiation, and ion beams. As a method for imagewise irradiating with actinic radiation, for example, as shown in FIG. 1(b), the photosensitive layer 20 is imagewise irradiated with actinic radiation through a mask pattern 30 in which a desired pattern is drawn, thereby photocuring the photosensitive layer 20 of the exposed areas. The mask pattern 30 may be of a negative type or a positive type, and one generally employed can be used. The radiation intensity during exposure is desirably 100 to 300 mJ/cm$^2$. The light source is not particularly limited and, for example, a carbon arc lamp, a xenon lamp, a low pressure mercury lamp, a high pressure mercury lamp, a super high pressure mercury lamp, or a metal halide lamp can be used. It is also possible to carry out the exposure by direct laser imaging without having to use a mask pattern.

After the exposure, in a step (iii) unexposed areas of the photosensitive layer (that is, the photosensitive layer of the unexposed portions) are selectively removed by development. Examples of the developing solution include good solvents such as N,N-dimethylformamide, N,N-dimethylacetamide, N-methyl-2-pyrrolidone, $\gamma$-butyrolactone, diethylene glycol dimethyl ether, triethylene glycol dimethyl ether, and dimethyl sulfoxide, and mixed solutions of the above-mentioned good solvents with poor solvents such as lower alcohols, ketones, water, aliphatic compounds, aromatic compounds, and alkylene glycol ether compounds such as butyl cellosolve acetate. Examples of the development method include a dip method, a spray method, a brushing method, and a scrubbing method. After the development, rinsing is carried out with water or a poor solvent as necessary, and drying at around 180° C. can give, as shown in FIG. 1(c), a coating 21 having a desired pattern and comprising the photosensitive resin composition according to the present invention (that is, a pattern 21 comprising a photosensitive resin composition according to the present invention). As development post treatments, heating at on the order of 60° C. to 250° C. or exposure at on the order of 0.2 to 10 J/cm$^2$ may be carried out as necessary, thereby further curing the coating pattern) 21 thus formed.

The coating thus obtained having the desired pattern, which comprises the photosensitive resin composition according to the present invention, can be used in various electronic components such as semiconductor devices and multilayer wiring boards. Specifically, it can be used for forming a surface protective film or an interlayer insulating film such as a junction coating film, a buffer coating film, or an $\alpha$-ray shielding film applied on a semiconductor device such as a semiconductor element, a lead frame, or a substrate, an interlayer insulating film of a multilayer wiring board, etc.

The electronic component according to the present invention has a coating comprising the photosensitive resin composition according to the present invention, that is, a photosensitive layer, as the above-mentioned surface protective film or interlayer insulating film, etc. As long as it has this photosensitive layer, there are no particular other restrictions, and various structures can be employed.

Figure 2:
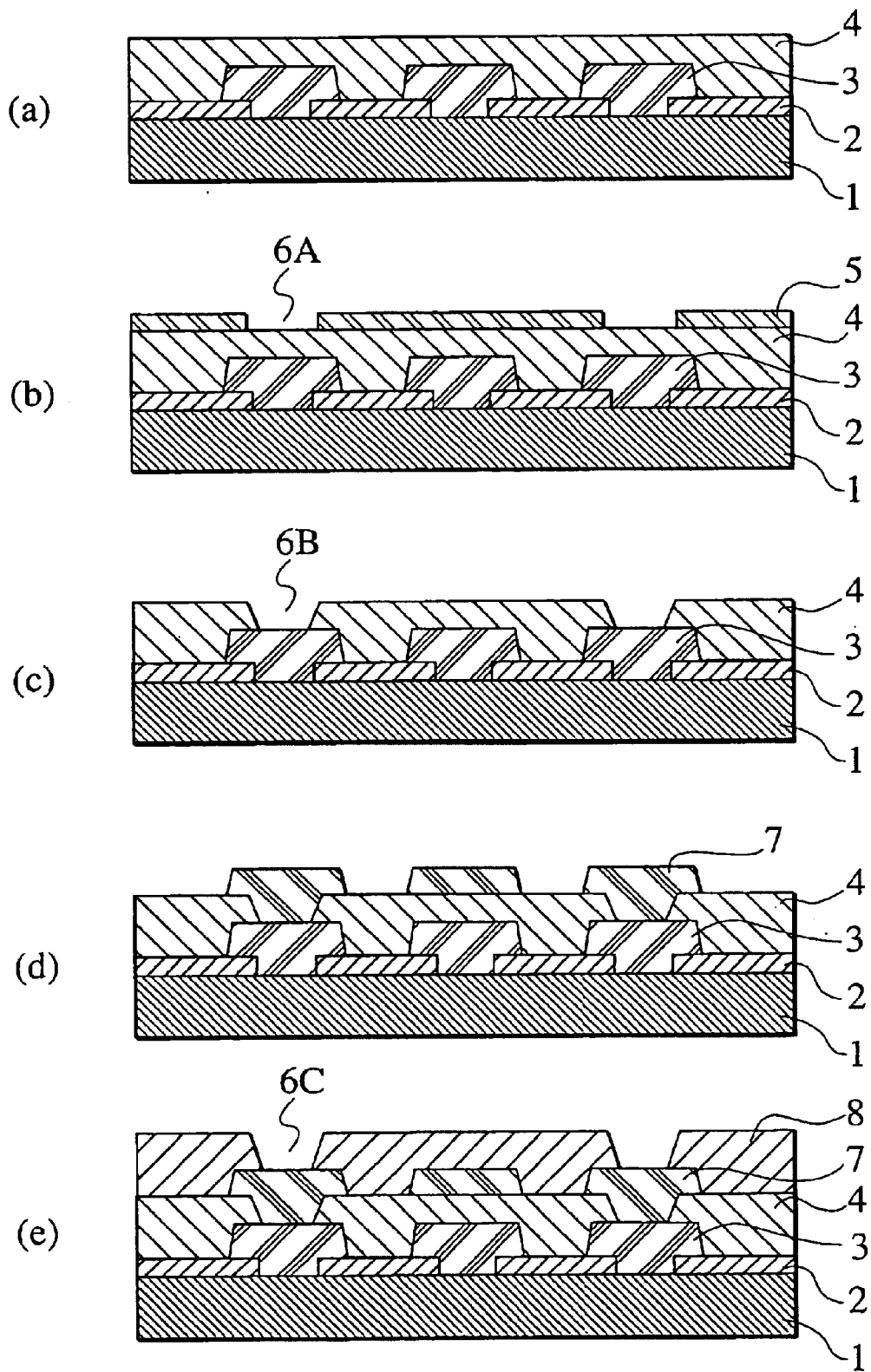
FIG. 2 is a schematic drawing showing one example of production steps for a multilayer wiring structure semiconductor device, which is one embodiment of the electronic component according to the present invention.

An example of the production process for a semiconductor device, which is one example of the electronic component, is explained specifically below by reference to FIG. 2.

A semiconductor substrate 1 such as a silicon substrate having a circuit element is covered, apart from predetermined portions of the circuit element, with a protective film 2 such as a silicon oxide film, and a first conductor layer 3 is formed on the exposed circuit element. On this semiconductor substrate an interlayer insulating film layer 4 is formed from a polyimide resin, etc. by a spin-coating method, etc. (FIG. 2(a), Step (a)).

Next, on the above-mentioned interlayer insulating film layer 4 a photosensitive resin layer 5 is formed from a cyclized rubber resin, a phenol novolac resin, etc. by a spin-coating method, etc., and windows 6A are provided by a known photoetching technique so as to allow predetermined areas of the interlayer insulating film layer 4 to be exposed (FIG. 2(b), Step (b)).

The interlayer insulating film layer 4 exposed through the windows 6A is selectively etched by dry etching means using a gas such as oxygen or carbon tetrafluoride so as to form windows 6B. Subsequently, the photosensitive resin layer 5 is completely removed using an etching solution that etches only the photosensitive resin layer 5 without etching the first conductor layer 3 exposed through the windows 6B (FIG. 2(c), Step (c)).

Furthermore, a second conductor layer 7 is formed using a known photoetching technique so as to achieve complete electrical connection with the first conductor layer 3 (FIG. 2(d), Step (d)).

In the case where a multilayer wiring structure with three or more layers is formed, the above-mentioned steps are repeated to form each layer.

Next, a surface protective film layer 8 is formed. In this example shown in FIG. 2, this surface protective film layer 8 is formed using the photosensitive resin composition according to the present invention. First, the photosensitive resin composition is applied by a spin-coating method and dried, and after irradiating with actinic radiation through a mask on which a pattern for forming windows 6C at predetermined areas is drawn, unexposed portions are developed and removed using a developing solution, thereby forming a pattern (FIG. 2(e) Step (e)).

In the above-mentioned production process example, the interlayer insulating film layer 4 can be formed using the photosensitive resin composition of the present invention.

Since the photosensitive resin composition of the present invention comprises the above-mentioned photosensitive resins (A) and/or (B) and the above-mentioned photopolymerizable compounds (C) and/or (D), it has excellent heat resistance, does not require treatment at a high temperature exceeding 300° C., the use thereof enables a pattern (a coating having the pattern) having excellent solvent resistance and, in particular, alkali resistance to be formed, and it can be suitably used as a material for a protective film or an insulating film for electronic components that cannot be subjected to high temperature treatment.

Since the pattern production process according to the present invention employs the above-mentioned photosensitive resin composition according to the present invention, a pattern that has excellent heat resistance and alkali resistance and can be used as a protective film or an insulating film can thereby be obtained. Furthermore, use of the photosensitive resin composition according to the present invention enables a photosensitive layer to be used as a protective film or an insulating film as it is, thereby providing an electronic component according to the present invention with good workability and productivity.

The present invention is now explained in further detail by reference to Examples. In the Examples below, the weight average molecular weight of the resin is a corresponding value (using polystyrene as a standard) obtained using Gel Permeation Chromatography (GPC) with a 0.05 mol/L phosphoric acid NMP solution as eluent, a solution flow rate of 1 ml/min., and detection with a UV detector (250 nm). In the tables below, (d1) is the monomer having at least 5 photopolymerizable unsaturated bonds per molecule, (d2) is the monomer having 2 to 4 photopolymerizable unsaturated bonds per molecule, (E) is the photopolymerization initiator, and (C) is the silane coupling agent having a photopolymerizable unsaturated bond. The amount of each component added in the tables is expressed as a value relative to 100 parts by weight of the total amount of photosensitive resin (polyamide resin and/or polyamideimide resin).

Synthesis of Photosensitive Resins
(1) Synthesis of Polyamide Resin (A-1)

A 500 ml four-necked flask equipped with a stirrer, a thermometer, a nitrogen gas inlet tube, and a calcium chloride tube was charged with 30.6 g of 2,2-bis[4-(4-aminophenoxy)phenyl]propane (hereinafter, denoted by 'BAPP'), 1.7 g of 4,4'-diaminodiphenyl ether (hereinafter, denoted by 'DDE'), 21.9 g of 2-methacryloyloxyethyl 3,5-diaminobenzoate, 3.3 g of 2,2'-methylenebis(4-ethyl-6-t-butylphenol), and 419.8 g of N-methyl-2-pyrrolidone (hereinafter, denoted by 'NMP'), and they were cooled to 0° C. under an atmosphere of nitrogen while stirring. After 27.8 g of propylene oxide was added, 16.2 g of isophthaloyl chloride and 16.2 g of terephthaloyl chloride were added, and a reaction was carried out while stirring at room temperature for 1 hour. The reaction solution thus obtained was poured into water, and this was pulverized by a mixer, washed with water, and then dried to give a polyamide resin (A-1) powder having a repeating unit molar ratio (U1)/(U3) of 50/50. The weight average molecular weight of the resin (A-1) thus obtained was 150,000.

(2) Synthesis of Polyamide Resin (A-2)

A synthesis was carried out in the same manner as that of the above-mentioned polyamide resin (A-1) except that 12.3 g of BAPP, 0.7 g of DDE, 35.0 g of 2-methacryloyloxyethyl 3,5-diaminobenzoate, 5.3 g of 2,2'-methylenebis(4-ethyl-6-t-butylphenol), and 381.5 g of NMP were used, and a polyamide resin (A-2) powder having a repeating unit molar ratio (U1)/(U3) of 80/20 was obtained. The weight average molecular weight of the resin (A-2) thus obtained was 107,000.

(3) Synthesis of Polyamide Resin (A-3)

A synthesis was carried out in the same manner as that of the above-mentioned polyamide resin (A-1) except that 42.9 g of BAPP, 2.3 g of DDE, 13.1 g of 2-methacryloyloxyethyl 3,5-diaminobenzoate, 2.0 g of 2,2'-methylenebis(4-ethyl-6-t-butylphenol), and 445.2 g of NMP were used, and a polyamide resin (A-3) powder having a repeating unit molar ratio (U1)/(U3) of 30/70 was obtained. The weight average molecular weight of the resin (A-3) thus obtained was 98,000.

(4) Synthesis of Polyamide Resin (X)

A 500 ml four-necked flask equipped with a stirrer, a thermometer, a nitrogen gas inlet tube, and a calcium chloride tube was charged with 61.2 g of BAPP, 3.3 g of DDE, and 483.5 g NMP, and they were cooled to 0° C. under an atmosphere of nitrogen while stirring. After 27.8 g of propylene oxide was added, 16.2 g of isophthaloyl chloride and 16.2 g of terephthaloyl chloride were added, and a reaction was carried out while stirring at room temperature for 1 hour. The reaction solution thus obtained was poured into water, and this was pulverized by a mixer, washed with water, and then dried to give a polyamide resin (X) powder having a repeating unit molar ratio (U1)/(U3) of 0/100. The weight average molecular weight of the resin (X) thus obtained was 102,000.

(5) Synthesis of Polyamideimide Resin (B-1)

A 1000 ml four-necked flask equipped with a stirrer, a thermometer, a nitrogen gas inlet tube, and a condenser was charged with 53.6 g of BAPP, 34.5 g of 2-methacryloyloxyethyl 3,5-diaminobenzoate, 5.2 g of 2,2'-methylenebis(4-ethyl-6-t-butylphenol), and 572.2 g of NMP, and they were cooled to 0° C. under an atmosphere of nitrogen while stirring, 55.0 g of trimellitic anhydride chloride was then added, and a reaction was carried out while stirring at room temperature for 1 hour. After adding 31.7 g of triethylamine to the reaction solution and stirring at room temperature for 1 hour, 133.3 g of acetic anhydride and 41.3 g of pyridine were added, and a reaction was carried out while stirring at 80° C. for 12 hours. The reaction solution was poured into water, and this was pulverized by a mixer, washed with water, and then dried to give a polyamideimide resin (B-1) powder. The weight average molecular weight of the resin (B-1) thus obtained was 120,000.

(6) Synthesis of Polyamideimide Resin (B-2)

A synthesis was carried out in the same manner as that of the above-mentioned polyamideimide resin (B-1) except that 23.4 g of BAPP, 60.2 g of 2-methacryloyloxyethyl 3,5-diaminobenzoate, 9.1 g of 2,2'-methylenebis(4-ethyl-6-t-butylphenol), 574.3 g of NMP, 60.0 g of trimellitic anhydride chloride, 34.6 g of triethylamine, 145.4 g of acetic anhydride, and 45.0 g of pyridine were used, and a polyamideimide resin (B-2) powder was obtained. The weight average molecular weight of the resin (B-2) thus obtained was 100,000.

(7) Synthesis of Polyamideimide Resin (B-3)

A synthesis was carried out in the same manner as that of the above-mentioned polyamideimide resin (B-1) except that 75.0 g of BAPP, 20.7 g of 2-methacryloyloxyethyl 3,5-diaminobenzoate, 3.1 g of 2,2'-methylenebis(4-ethyl-6-t-butylphenol), 602.7 g of NMP, 55.0 g of trimellitic anhydride chloride, 31.7 g of triethylamine, 133.3 g of acetic anhydride, and 41.3 g of pyridine were used, and a polyamideimide resin (B-3) powder was obtained. The weight average molecular weight of the resin (B-3) thus obtained was 113,000.

(8) Synthesis of Polyamideimide Resin (Y)

A 1000 ml four-necked flask equipped with a stirrer, a thermometer, a nitrogen gas inlet tube, and a condenser was charged with 77.9 g of BAPP and 471.6 g of NMP, and they were cooled to 0° C. under an atmosphere of nitrogen while stirring, 40.0 g of trimellitic anhydride chloride was then added, and a reaction was carried out at room temperature while stirring for 1 hour. After adding 23.0 g of triethylamine to the reaction solution and stirring at room temperature for 1 hour, 96.9 g of acetic anhydride and 30.0 g of pyridine were added, and a reaction was carried out while stirring at 80° C. for 12 hours. The reaction solution thus obtained was poured into water, and this was pulverized by a mixer, washed with water, and then dried to give a polyamideimide resin (Y) powder. The weight average molecular weight of the resin (Y) thus obtained was 125,000.

Evaluation Methods for Coatings

The methods for evaluating the characteristics of the coatings were as follows.

(1) Resolution

A patterned coating was inspected by microscope, and a minimum value ($\mu$m) at which the line & space (L/S) pattern widths were identical was defined as the resolution.

(2) Alkali Resistance

A wafer having a patterned coating formed thereon was subjected to a Pressure Cooker Test (PCT) in a 0.1N aqueous solution of sodium hydroxide at 121° C. and 0.2 MPa (2 atm) for 10 hours, following which the surface condition of the coating was inspected.

(3) Acid Resistance

A wafer having a patterned coating formed thereon was immersed in a 0.1N aqueous solution of hydrochloric acid at 60° C., and further subjected to ultrasonic vibration (frequency: 42 kHz) for 2 hours, and the surface condition of the coating was inspected.

(4) Organic Solvent Resistance

A wafer having a patterned coating formed thereon was immersed in NMP at 60° C. for 1 hour, and further subjected to ultrasonic vibration (frequency: 42 kHz) for 2 hours, and the surface condition of the coating was inspected.

(5) 5% Weight Loss Temperature

Measured using thermogravimetry/differential thermal analysis in air at a rate of temperature increase of 10° C./min.

EXAMPLES

Example 1A

To 2.179 g of the polyamide resin (A-1) powder were added 0.218 g of vinyltrimethoxysilane (SZ6300 manufactured by Dow Corning Toray Silicone Co., Ltd.: hereinafter, denoted by 'SZ6300') as the silane coupling agent (C) having a photopolymerizable unsaturated bond, 2.688 g of trimethylolpropane trimethacrylate (NK ester TMPT manufactured by Shin-Nakamura Chemical Co., Ltd.; hereinafter, denoted by 'TMPT') as the monomer (d2) having 2 to 4 photopolymerizable unsaturated bonds per molecule, 1.016 g of benzophenone and 0.335 g of N,N'-tetraethyl-4,4'-diaminobenzophenone as the photopolymerization initiators (E), and 12.53 g of diethylene glycol dimethyl ether (hereinafter, denoted by 'DMDG') and 12.53 g of NMP as the organic solvents, and they were mixed to give a photosensitive resin composition.

The photosensitive resin composition thus obtained was applied on a 5 inch silicon wafer (surface: Si) by a spin-coating method and dried by heating at 90° C. for 3 minutes so as to form a coating. The coating thus obtained was imagewise exposed at 1000 mJ/cm$^2$ using a super high pressure mercury lamp through a negative mask, and subsequently developed using triethylene glycol dimethyl ether/butyl cellosolve acetate (60/40) (ratio by weight). The coating was washed with water and then dried in a dryer at 180° C. for 1 hour to give a patterned coating having a dry film thickness of 3.0 $\mu$m.

Example 2A

A photosensitive resin composition was obtained by mixing the components in the same manner as in Example 1A except that 3-methacryloyloxypropyltrimethoxysilane (SZ6030 manufactured by Dow Corning Toray Silicone Co., Ltd.; hereinafter, denoted by 'SZ6030') was used as the silane coupling agent (C).

Using the photosensitive resin composition thus obtained, a patterned coating having a film thickness (after drying) of 2.6 $\mu$m was obtained by the same operations as in Example 1A.

Example 3A

A photosensitive resin composition was obtained in the same manner as in Example 1A except that 0.623 g of TMPT, 0.234 g of benzophenone, 0.077 g of N,N'-tetraethyl-4,4'-diaminobenzophenone, 6.22 g of DMDG, and 6.22 g of NMP were used.

Using the photosensitive resin composition thus obtained, a patterned coating having a film thickness (after drying) of 2.6 $\mu$m was obtained by the same operations as in Example 1A.

Example 4A

A photosensitive resin composition was obtained in the same manner as in Example 1A except that 0.129 g of TMPT, 0.193 g of benzophenone, 0.064 g of N,N'-tetraethyl-4,4'-diaminobenzophenone, 6.73 g of DMDG, and 6.73 g of NMP were used.

Using the photosensitive resin composition thus obtained, a patterned coating having a film thickness (after drying) of 3.0 μm was obtained by the same operations as in Example 1A.

Example 5A

A photosensitive resin composition was obtained in the same manner as in Example 3A except that the polyamide resin (A-2) was used.

Using the photosensitive resin composition thus obtained, a patterned coating having a film thickness (after drying) of 2.0 μm was obtained by the same operations as in Example 1A.

Example 6A

A photosensitive resin composition was obtained in the same manner as in Example 3A except that the polyamide resin (A-3) was used.

Using the photosensitive resin composition thus obtained, a patterned coating having a film thickness (after drying) of 2.5 μm was obtained by the same operations as in Example 1A.

Comparative Example 1A

A photosensitive resin composition was prepared by carrying out the same operations as in Example 1A except that the polyamide resin (X) powder was used. Using this photosensitive resin composition, a coating was formed, exposed, and developed by the same operations as in Example 1A, but a patterned coating was not obtained.

Comparative Example 2A

A photosensitive resin composition was obtained in the same manner as in Example 1A except that the silane coupling agent (C) component having a photopolymerizable unsaturated bond was not used. Using this photosensitive resin composition, a patterned coating having a film thickness (after drying) of 2.5 μm was obtained by the same operations as in Example 1A.

Comparative Example 3A

A photosensitive resin composition was obtained in the same manner as in Example 1A except that γ-glycidoxypropyltrimethoxysilane (SH6040 manufactured by Dow Corning Toray Silicone Co., Ltd.; hereinafter, denoted by 'SH6040') was used instead of the silane coupling agent (C) having a photopolymerizable unsaturated bond.

Using this photosensitive resin composition, a patterned coating having a film thickness (after drying) of 3.0 μm was obtained by the same operations as in Example 1A.

The amounts added for the photosensitive resin compositions prepared in Examples 1A to 6A and Comparative Examples 1A to 3A and the weight average molecular weights (Mw) of the polyamide resins are summarized in Table 1. The evaluation results of the coatings obtained are summarized in Table 2.

TABLE 1

| | Polyamide resin | | Amounts added (parts by weight) | | | Other |
|---|---|---|---|---|---|---|
| | (U1)/(U3) | Mw | (d2) | (E) | (C) | coupling agent |
| Ex. 1A | 50/50 | 150,000 | 123 | 62 | 10 | 0 |
| Ex. 2A | 50/50 | 150,000 | 123 | 62 | 10 | 0 |
| Ex. 3A | 50/50 | 150,000 | 29 | 14 | 10 | 0 |
| Ex. 4A | 50/50 | 150,000 | 6 | 12 | 10 | 0 |
| Ex. 5A | 80/20 | 107,000 | 29 | 14 | 10 | 0 |
| Ex. 6A | 30/70 | 98,000 | 29 | 14 | 10 | 0 |
| Comp. Ex. 1A | 0/100 | 102,000 | 123 | 62 | 10 | 0 |
| Comp. Ex. 2A | 50/50 | 150,000 | 123 | 62 | 0 | 0 |
| Comp. Ex. 3A | 50/50 | 150,000 | 123 | 62 | 0 | 10 |

TABLE 2

| | | Coating surface condition | | | |
|---|---|---|---|---|---|
| | Resolution (μm) | Alkali resistance | Acid resistance | Organic solv. resistance | 5% weight loss temperature |
| Ex. 1A | 42 | No change | No change | No change | 295° C. |
| Ex. 2A | 45 | No change | No change | No change | 286° C. |
| Ex. 3A | 25 | No change | No change | No change | 277° C. |
| Ex. 4A | 22 | No change | No change | No change | 290° C. |
| Ex. 5A | 28 | No change | No change | No change | 282° C. |
| Ex. 6A | 36 | No change | No change | No change | 303° C. |
| Comp. Ex. 1A | —*1 | — | — | — | — |
| Comp. Ex. 2A | 32 | Peeled off | No change | No change | 302° C. |
| Comp. Ex. 3A | 28 | Rough surface | No change | No change | 292° C. |

*1: Pattern not obtained.

In Examples 1A to 6A, patterned coatings having excellent solvent resistance and, in particular, alkali resistance, and good heat resistance were obtained. In Comparative Example 1A, since a polyamide resin containing no repeating unit (U1) was used, the photosensitive characteristics were poor, and a patterned coating was not obtained. In Comparative Examples 2A and 3A, since the silane coupling agent (C) having a photopolymerizable unsaturated bond was not used, the alkali resistance of the coatings was poor, and the coating peeled off after the PCT, or a rough surface was observed.

Example 1B

To 2.179 g of the polyamide resin (A-1) powder were added 2.688 g of a mixture of dipentaerythritol pentaacrylate and dipentaerythritol hexaacrylate (Kayarad DPHA manufactured by Nippon Kayaku Co., Ltd.; hereinafter, denoted by 'DPHA') as the monomers (d1) having at least 5 photopolymerizable unsaturated bonds per molecule, 1.016 g of benzophenone and 0.335 g of N,N'-tetraethyl-4,4'-diaminobenzophenone as the photopolymerization initiators (E), and 12.53 g of DMDG and 12.53 g of NMP as the organic solvents, and they were mixed to give a photosensitive resin composition.

The photosensitive resin composition thus obtained was applied on a 5 inch silicon wafer (surface: Si) by a spin-coating method and dried by heating at 90° C. for 3 minutes so as to form a coating. The coating thus obtained was imagewise exposed at 1000 mJ/cm$^2$ using a super high pressure mercury lamp through a negative mask, and subsequently developed using triethylene glycol dimethyl ether/butyl cellosolve acetate (60/40) (ratio by weight). The coating was washed with water and then dried in a dryer at 180° C. for 1 hour to give a patterned coating having a dry film thickness of 3.2 μm.

Example 2B

A photosensitive resin composition was obtained in the same manner as in Example 1B except that 0.538 g of TMPT, which is the monomer (d2) having 2 to 4 photopolymerizable unsaturated bonds per molecule, and 2.150 g of DPHA, which is the monomer (d1) having at least photopolymerizable unsaturated bonds per molecule, were used as the photopolymerizable unsaturated monomers.

Using this photosensitive resin composition, a patterned coating having a film thickness (after drying) of 3.0 μm was obtained by the same operations as in Example 1B.

Example 3B

A photosensitive resin composition was obtained in the same manner as in Example 1B except that 1.344 g of TMPT and 1.344 g of DPHA were used as the photopolymerizable unsaturated monomers.

Using this photosensitive resin composition, a patterned coating having a film thickness (after drying) of 2.8 μm was obtained by the same operations as in Example 1B.

Example 4B

A photosensitive resin composition was obtained in the same manner as in Example 1B except that 0.623 g of DPHA, 0.234 g of benzophenone, 0.077 g of N,N'-tetraethyl-4,4'-diaminobenzophenone, 6.22 g of DMDG, and 6.22 g of NMP were used.

Using this photosensitive resin composition, a patterned coating having a film thickness (after drying) of 3.0 μm was obtained by the same operations as in Example 1B.

Example 5B

A photosensitive resin composition was obtained in the same manner as in Example 1B except that 0.129 g of DPHA, 0.193 g of benzophenone, 0.064 g of N,N'-tetraethyl-4,4'-diaminobenzophenone, 6.73 g of DMDG, and 6.73 g of NMP were used.

Using this photosensitive resin composition, a patterned coating having a film thickness (after drying) of 2.5 μm was obtained by the same operations as in Example 1B.

Example 6B

A photosensitive resin composition was obtained in the same manner as in Example 4B except that the polyamide resin (A-2) powder was used.

Using this photosensitive resin composition, a patterned coating having a film thickness (after drying) of 2.6 μm was obtained by the same operations as in Example 1B.

Example 7B

A photosensitive resin composition was obtained in the same manner as in Example 4B except that the polyamide resin (A-3) powder was used.

Using this photosensitive resin composition, a patterned coating having a film thickness (after drying) of 3.0 μm was obtained by the same operations as in Example 1B.

Comparative Example 1B

A photosensitive resin composition was obtained in the same manner as in Example 1B except that the polyamide resin (X) powder was used.

Using this photosensitive resin composition, a coating was formed, exposed, and developed by the same operations as in Example 1B, but a patterned coating was not obtained.

Comparative Example 2B

A photosensitive resin composition was obtained in the same manner as in Example 1B except that 2.688 g of TMPT was used as the photopolymerizable unsaturated monomer.

Using this photosensitive resin composition, a patterned coating having a film thickness (after drying) of 3.0 μm was obtained by the same operations as in Example 1B.

The amounts added for the resin compositions prepared in Examples 1B to 7B and Comparative Examples 1B and 2B and the weight average molecular weights (Mw) of the polyamide resins are summarized in Table 3. The evaluation results of the coatings thus obtained are summarized in Table 4.

TABLE 3

| | Polyamide resin | | Amounts added (parts by weight) | | |
|---|---|---|---|---|---|
| | (U1)/(U3) | Mw | (d2) | (d1) | (E) |
| Ex. 1B | 50/50 | 150,000 | 0 | 123 | 62 |
| Ex. 2B | 50/50 | 150,000 | 24.6 | 98.4 | 62 |
| Ex. 3B | 50/50 | 150,000 | 61.5 | 61.5 | 62 |
| Ex. 4B | 50/50 | 150,000 | 0 | 29 | 14 |
| Ex. 5B | 50/50 | 150,000 | 0 | 6 | 12 |
| Ex. 6B | 80/20 | 107,000 | 0 | 29 | 14 |
| Ex. 7B | 30/70 | 98,000 | 0 | 29 | 14 |
| Comp. Ex. 1B | 0/100 | 102,000 | 0 | 123 | 62 |
| Comp. Ex. 2B | 50/50 | 150,000 | 123 | 0 | 62 |

TABLE 4

| | Coating surface condition | | | | |
|---|---|---|---|---|---|
| | Resolution (μm) | Alkali resistance | Acid resistance | Organic solv. resistance | 5% weight loss temperature |
| Ex. 1B | 48 | No change | No change | No change | 295° C. |
| Ex. 2B | 46 | No change | No change | No change | 286° C. |
| Ex. 3B | 45 | No change | No change | No change | 277° C. |
| Ex. 4B | 20 | No change | No change | No change | 290° C. |
| Ex. 5B | 26 | No change | No change | No change | 282° C. |
| Ex. 6B | 35 | No change | No change | No change | 303° C. |
| Ex. 7B | 40 | No change | No change | No change | 288° C. |
| Comp. Ex. 1B | —*1 | — | — | — | — |
| Comp. Ex. 2B | 40 | Peeled off | No change | No change | 292° C. |

*1: Pattern not obtained.

In Examples 1B to 7B, patterned coatings having excellent alkali resistance and good heat resistance were obtained. In Comparative Example 1B, since a polyamide resin containing no repeating unit (U1) was used, the photosensitive characteristics were poor, and a patterned coating was not obtained. In Comparative Example 2B, since the monomer (d1) was not used as the photopolymerizable unsaturated monomer, the alkali resistance of the coating was poor, and the coating peeled off after the PCT.

Example 1C

To 2.179 g of the polyamideimide resin (B-1) powder were added 2.688 g of DPHA as the monomer (d1), 1.016 g of benzophenone and 0.335 g of N,N'-tetraethyl-4,4'-diaminobenzophenone as the photopolymerization initiators (E), and 12.53 g of DMDG and 12.53 g of NMP as the organic solvents, and they were mixed to give a photosensitive resin composition.

This photosensitive resin composition was applied on a 5 inch silicon wafer (surface: Si) by a spin-coating method and dried by heating at 90° C. for 3 minutes so as to form a coating having a film thickness of 4.0 μm. The coating thus obtained was imagewise exposed through a negative mask at 1000 mJ/cm$^2$ using a super high pressure mercury lamp, and subsequently developed using triethylene glycol dimethyl ether/butyl cellosolve acetate (60/40) (ratio by weight). The coating was washed with isopropyl alcohol and then dried in a dryer at 180° C. for 1 hour to give a patterned coating having a film thickness of 3.2 μm.

Example 2C

A photosensitive resin composition was obtained in the same manner as in Example 1C except that 0.538 g of TMPT and 2.150 g of DPHA were used as the photopolymerizable unsaturated monomers.

Using this photosensitive resin composition, a patterned coating having a film thickness (after drying) of 3.0 μm was obtained by the same operations as in Example 1C.

Example 3C

A photosensitive resin composition was obtained in the same manner as in Example 1C except that 1.344 g of TMPT and 1.344 g of DPHA were used as the photopolymerizable unsaturated monomers.

Using this photosensitive resin composition, a patterned coating having a film thickness (after drying) of 2.8 μm was obtained by the same operations as in Example 1C.

Example 4C

A photosensitive resin composition was obtained in the same manner as in Example 1C except that 0.623 g of DPHA, 0.234 g of benzophenone, 0.077 g of N,N'-tetraethyl-4,4'-diaminobenzophenone, 6.22 g of DMDG, and 6.22 g of NMP were used.

Using this photosensitive resin composition, a patterned coating having a film thickness (after drying) of 3.0 μm was obtained by the same operations as in Example 1C.

Example 5C

A photosensitive resin composition was obtained in the same manner as in Example 1C except that 0.129 g of DPHA, 0.193 g of benzophenone, 0.064 g of N,N'-tetraethyl-4,4'-diaminobenzophenone, 6.73 g of DMDG, and 6.73 g of NMP were used.

Using this photosensitive resin composition, a patterned coating having a film thickness (after drying) of 2.5 μm was obtained by the same operations as in Example 1C.

Example 6C

A photosensitive resin composition was obtained in the same manner as in Example 4C except that the polyamideimide resin (B-2) powder was used.

Using this photosensitive resin composition, a patterned coating having a film thickness (after drying) of 2.9 μm was obtained by the same operations as in Example 1C.

Example 7C

A photosensitive resin composition was obtained in the same manner as in Example 4C except that the polyamideimide resin (B-3) powder was used.

Using this photosensitive resin composition, a patterned coating having a film thickness (after drying) of 2.7 μm was obtained by the same operations as in Example 1C.

Comparative Example 1C

A photosensitive resin composition was obtained in the same manner as in Example 1C except that the polyamideimide resin (Y) powder was used.

Using this photosensitive resin composition, a coating was formed, exposed, and developed by the same operations as in Example 1C, but a patterned coating was not obtained.

Comparative Example 2C

A photosensitive resin composition was obtained in the same manner as in Example 1C except that 2.688 g of TMPT was used as the photopolymerizable unsaturated monomer.

Using this photosensitive resin composition, a patterned coating having a film thickness (after drying) of 3.0 μm was obtained by the same operations as in Example 1C.

The amounts added for the resin compositions prepared in Examples 1C to 7C and Comparative Examples 1C and 2C and the weight average molecular weights (Mw) of the polyamideimide resins are summarized in Table 5. The evaluation results of the coatings obtained are summarized in Table 6.

TABLE 5

| | Polyamideimide resin | | Amounts added (parts by weight) | | |
|---|---|---|---|---|---|
| | (U2)/(U4) | Mw | (d2) | (d1) | (E) |
| Ex. 1C | 50/50 | 120,000 | 0 | 123 | 62 |
| Ex. 2C | 50/50 | 120,000 | 24.6 | 98.4 | 62 |
| Ex. 3C | 50/50 | 120,000 | 61.5 | 61.5 | 62 |
| Ex. 4C | 50/50 | 120,000 | 0 | 29 | 14 |
| Ex. 5C | 50/50 | 120,000 | 0 | 6 | 12 |
| Ex. 6C | 80/20 | 100,000 | 0 | 29 | 14 |
| Ex. 7C | 30/70 | 113,000 | 0 | 29 | 14 |
| Comp. Ex. 1C | 0/100 | 125,000 | 0 | 123 | 62 |
| Comp. Ex. 2C | 50/50 | 120,000 | 123 | 0 | 62 |

TABLE 6

| | | Coating surface condition | | | |
|---|---|---|---|---|---|
| | Resolution (μm) | Alkali resistance | Acid resistance | Organic solv. resistance | 5% weight loss temperature |
| Ex. 1C | 80 | No change | No change | No change | 310° C. |
| Ex. 2C | 60 | No change | No change | No change | 307° C. |
| Ex. 3C | 55 | No change | No change | No change | 305° C. |
| Ex. 4C | 40 | No change | No change | No change | 301° C. |
| Ex. 5C | 35 | No change | No change | No change | 302° C. |
| Ex. 6C | 50 | No change | No change | No change | 309° C. |
| Ex. 7C | 50 | No change | No change | No change | 297° C. |
| Comp. Ex. 1C | —*1 | — | — | — | — |
| Comp. Ex. 2C | 50 | Peeled off | No change | No change | 303° C. |

*1: Pattern not obtained.

In Examples 1C to 7C, patterned coatings having excellent alkali resistance and good heat resistance were obtained.

In Comparative Example 1C, since a polyamideimide resin containing no repeating unit (U2) was used, the photosensitive characteristics were poor, and a patterned coating was not obtained. In Comparative Example 2C, since the monomer (d1) was not used as the photopolymerizable unsaturated monomer, the alkali resistance of the coating was poor, and the coating peeled off after the PCT.

Example 1D

To 2.179 g of the polyamideimide resin (B-1) powder were added 0.218 g of SZ6300 as the silane coupling agent (C) having a photopolymerizable unsaturated bond, 2.688 g of TMPT as the monomer (d2), 1.016 g of benzophenone and 0.335 g of N,N'-tetraethyl-4,4'-diaminobenzophenone as the photopolymerization initiators (E), and 12.53 g of DMDG and 12.53 g of NMP as the organic solvents, and they were mixed to give a photosensitive resin composition.

This photosensitive resin composition was applied on a 5 inch silicon wafer (surface: Si) by a spin-coating method and dried by heating at 90° C. for 3 minutes so as to form a coating having a film thickness of 3.8 µm. The coating thus obtained was imagewise exposed through a negative mask at 1000 mJ/cm$^2$ by a super high pressure mercury lamp, and subsequently developed using triethylene glycol dimethyl ether/butyl cellosolve acetate (60/40) (ratio by weight). The coating was washed with isopropyl alcohol and then dried in a dryer at 180° C. for 1 hour to give a patterned coating having a film thickness of 3.0 µm.

Example 2D

A photosensitive resin composition was obtained by mixing the components in the same manner as in Example 1D except that SZ6030 was used as the silane coupling agent (C).

Using the photosensitive resin composition thus obtained, a patterned coating having a film thickness (after drying) of 2.6 µm was obtained by the same operations as in Example 1D.

Example 3D

A photosensitive resin composition was obtained in the same manner as in Example 1D except that 0.623 g of TMPT, 0.234 g of benzophenone, 0.077 g of N,N'-tetraethyl-4,4'-diaminobenzophenone, 6.22 g of DMDG, and 6.22 g of NMP were used.

Using the photosensitive resin composition thus obtained, a patterned coating having a film thickness (after drying) of 2.6 µm was obtained by the same operations as in Example 1D.

Example 4D

A photosensitive resin composition was obtained in the same manner as in Example 1D except that 0.129 g of TMPT, 0.193 g of benzophenone, 0.064 g of N,N'-tetraethyl-4,4'-diaminobenzophenone, 6.73 g of DMDG, and 6.73 g of NMP were used.

Using the photosensitive resin composition thus obtained, a patterned coating having a film thickness (after drying) of 3.0 µm was obtained by the same operations as in Example 1D.

Example 5D

A photosensitive resin composition was obtained in the same manner as in Example 3D except that the polyamideimide resin (B-2) powder was used.

Using the photosensitive resin composition thus obtained, a patterned coating having a film thickness (after drying) of 2.0 µm was obtained by the same operations as in Example 1D.

Example 6D

A photosensitive resin composition was obtained in the same manner as in Example 3D except that the polyamideimide resin (B-3) powder was used.

Using the photosensitive resin composition thus obtained, a patterned coating having a film thickness (after drying) of 2.5 µm was obtained by the same operations as in Example 1D.

Comparative Example 1D

A photosensitive resin composition was obtained in the same manner as in Example 1D except that the polyamideimide resin (Y) powder was used.

Using this photosensitive resin composition, a coating was formed, exposed, and developed by the same operations as in Example 1D, but a patterned coating was not obtained.

Comparative Example 2D

A photosensitive resin composition was obtained in the same manner as in Example 1D except that the silane coupling agent (C) component having a photopolymerizable unsaturated bond was not used.

Using this photosensitive resin composition, a patterned coating having a film thickness (after drying) of 2.5 µm was obtained by the same operations as in Example 1D.

Comparative Example 3D

A photosensitive resin composition was obtained in the same manner as in Example 1D except that SH6040 was used instead of the silane coupling agent (C) having a photopolymerizable unsaturated bond.

Using this photosensitive resin composition, a patterned coating having a film thickness (after drying) of 3.0 µm was obtained by the same operations as in Example 1D.

The amounts added for the photosensitive resin compositions prepared in Examples 1D to 6D and Comparative Examples 1D to 3D and the weight average molecular weights (Mw) of the polyamideimide resins are summarized in Table 7. The evaluation results of the coatings obtained are summarized in Table 8.

TABLE 7

| | Polyamideimide resin | | Amounts added (parts by weight) | | | Other |
|---|---|---|---|---|---|---|
| | (U2)/(U4) | Mw | (d2) | (E) | (C) | coupling agent |
| Ex. 1D | 50/50 | 120,000 | 123 | 62 | 10 | 0 |
| Ex. 2D | 50/50 | 120,000 | 123 | 62 | 10 | 0 |
| Ex. 3D | 50/50 | 120,000 | 29 | 14 | 10 | 0 |
| Ex. 4D | 50/50 | 120,000 | 6 | 12 | 10 | 0 |
| Ex. 5D | 80/20 | 100,000 | 29 | 14 | 10 | 0 |
| Ex. 6D | 30/70 | 113,000 | 29 | 14 | 10 | 0 |
| Comp. Ex. 1D | 0/100 | 125,000 | 123 | 62 | 10 | 0 |
| Comp. Ex. 2D | 50/50 | 120,000 | 123 | 62 | 0 | 0 |
| Comp. Ex. 3D | 50/50 | 120,000 | 123 | 62 | 0 | 10 |

TABLE 8

| | Resolution (μm) | Coating surface condition | | | 5% weight loss temperature |
| | | Alkali resistance | Acid resistance | Organic solv. resistance | |
| --- | --- | --- | --- | --- | --- |
| Ex. 1D | 55 | No change | No change | No change | 305° C. |
| Ex. 2D | 50 | No change | No change | No change | 302° C. |
| Ex. 3D | 35 | No change | No change | No change | 301° C. |
| Ex. 4D | 30 | No change | No change | No change | 301° C. |
| Ex. 5D | 30 | No change | No change | No change | 309° C. |
| Ex. 6D | 40 | No change | No change | No change | 302° C. |
| Comp. Ex. 1D | —*1 | — | — | — | — |
| Comp. Ex. 2D | 50 | Peeled off | No change | No change | 303° C. |
| Comp. Ex. 3D | 50 | Rough Surface | No change | No change | 302° C. |

*1Pattern not obtained.

In Examples 1D to 6D, patterned coatings having excellent solvent resistance and, in particular, alkali resistance, and good heat resistance were obtained. In Comparative Example 1D, since a polyamideimide resin containing no repeating unit (U2) was used, the photosensitive characteristics were poor, and a patterned coating was not obtained. In Comparative Examples 2D and 3D, since the silane coupling agent (C) having a photopolymerizable unsaturated bond was not used, the alkali resistance of the coatings was poor, and the coating peeled off after the PCT, or a rough surface was observed.

Example 1E

To 1.090 g of the polyamide resin (A-1) powder and 1.090 g of the polyamideimide resin (B-1) powder were added 0.218 g of SZ6030 as the silane coupling agent (C), 0.623 g of DPHA as the monomer (d1) having at least 5 photopolymerizable unsaturated bonds per molecule, 0.234 g of benzophenone and 0.077 g of N,N'-tetraethyl-4,4'-diaminobenzophenone as the photopolymerization initiators, and 6.22 g of DMDG and 6.22 g of NMP as the organic solvents, and they were mixed to give a photosensitive resin composition.

Using the photosensitive resin composition thus obtained, a patterned coating having a film thickness (after drying) of 2.8 μm was obtained by the same operations as in Example 1A.

Example 2E

A photosensitive resin composition was obtained in the same manner as in Example 1E except that instead of the monomer (d1) 0.623 g of TMPT was used as the monomer (d2) having 2 to 4 photopolymerizable unsaturated bonds per molecule.

Using the photosensitive resin composition thus obtained, a patterned coating having a film thickness (after drying) of 2.7 μm was obtained by the same operations as in Example 1A.

Example 3E

A photosensitive resin composition was obtained in the same manner as in Example 1E except that the silane coupling agent (C) component having a photopolymerizable unsaturated bond was not used.

Using the photosensitive resin composition thus obtained, a patterned coating having a film thickness (after drying) of 2.7 μm was obtained by the same operations as in Example 1A.

Example 4E

A photosensitive resin composition was obtained in the same manner as in Example 1E except that 2.179 g of the polyamide resin (A-1) powder was used as the photosensitive resin.

Using the photosensitive resin composition thus obtained, a patterned coating having a film thickness (after drying) of 2.8 μm was obtained by the same operations as in Example 1A.

Example 5E

A photosensitive resin composition was obtained in the same manner as in Example 1E except that 2.179 g of the polyamideimide resin (B-1) powder was used as the photosensitive resin.

Using the photosensitive resin composition thus obtained, a patterned coating having a film thickness (after drying) of 3.0 μm was obtained by the same operations as in Example 1A.

The amounts added for the photosensitive resin compositions prepared in Examples 1E to 5E are summarized in Table 9. The evaluation results of the coatings obtained are summarized in Table 10.

TABLE 9

| Example | (A-1)/(B-1) | (d1) | (d2) | (E) | (C) |
| --- | --- | --- | --- | --- | --- |
| 1E | 50/50 | 29 | 0 | 14 | 10 |
| 2E | 50/50 | 0 | 29 | 14 | 10 |
| 3E | 50/50 | 29 | 0 | 14 | 0 |
| 4E | 100/0 | 29 | 0 | 14 | 10 |
| 5E | 0/100 | 29 | 0 | 14 | 10 |

TABLE 10

| | Resolution (μm) | Coating surface condition | | | 5% weight loss temperature |
| | | Alkali resistance | Acid resistance | Organic solv. resistance | |
| --- | --- | --- | --- | --- | --- |
| Ex. 1E | 30 | No change | No change | No change | 285° C. |
| Ex. 2E | 28 | No change | No change | No change | 282° C. |
| Ex. 3E | 30 | No change | No change | No change | 286° C. |
| Ex. 4E | 20 | No change | No change | No change | 292° C. |
| Ex. 5E | 36 | No change | No change | No change | 303° C. |

In Examples 1E to 5E, patterned coatings having excellent solvent resistance and, in particular, alkali resistance, and good heat resistance were obtained.

The disclosure of the present application is related to the subject matter of Japanese Patent Application No. 2001-202458 filed on Jul. 3, 2001, Japanese Patent Application No. 2001-202459 filed on Jul. 3, 2001, Japanese Patent Application No. 2002-85768 filed on Mar. 26, 2002, and Japanese Patent Application No. 2002-85769 filed on Mar. 26, 2002, the disclosures of which are incorporated herein by reference.

It is to be noted that, besides those already mentioned above, various changes and modifications can be made in the above-mentioned embodiments without departing from the novel and advantageous features of the present invention. Therefore, all such changes and modifications are intended to be included within the scope of the appended claims.

What is claimed is:

1. A photosensitive resin composition comprising:

at least one photosensitive resin among a polyamide resin (A) having a repeating unit (U1) represented by general formula (I) below and a polyamideimide resin (B) having a repeating unit (U2) represented by general formula (II); and at least one photopolymerizable compound among a silane coupling agent (C) having a photopolymerizable unsaturated bond and a photopolymerizable unsaturated monomer (D) comprising a monomer (d1) having at least 5 photopolymerizable unsaturated bonds per molecule General formula (I):

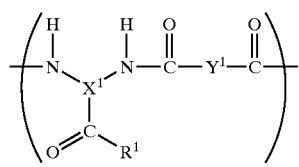
(I)

(in the formula, $X^1$ denotes a trivalent organic group having an aromatic ring, $Y^1$ denotes a divalent organic group having an aromatic ring, and $R^1$ denotes a monovalent organic group having a photosensitive group)

General formula (II):

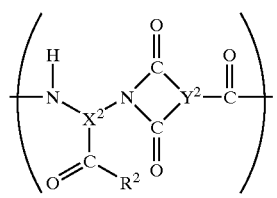
(II)

(in the formula, $X^2$ and $Y^2$ denote trivalent organic groups having an aromatic ring, and $R^2$ denotes a monovalent organic group having a photosensitive group).

2. The photosensitive resin composition according to claim 1, wherein the polyamide resin (A) has in addition a repeating unit (U3) represented by general formula (III):

(III)

(in the formula, $Y^1$ and $Z^1$ denote divalent organic groups having an aromatic ring).

3. The photosensitive resin composition according to claim 1, wherein the polyamideimide resin (B) has in addition a repeating unit (U4) represented by general formula (IV):

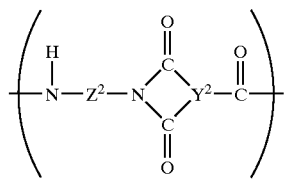
(IV)

(in the formula, $Y^2$ denotes a trivalent organic group having an aromatic ring, and $Z^2$ denotes a divalent organic group having an aromatic ring).

4. The photosensitive resin composition according to claim 2, wherein the repeating units (U1) and (U3) are contained at a molar ratio (U1):(U3) of 2:8 to 9:1.

5. The photosensitive resin composition according to claim 3, wherein the repeating units (U2) and (U4) are contained at a molar ratio (U2):(U4) of 2:8 to 9:1.

6. The photosensitive resin composition according to claim 1, wherein the polyamide resin (A) has a weight average molecular weight of 8,000 to 200,000.

7. The photosensitive resin composition according to claim 1, wherein the polyamideimide resin (B) has a weight average molecular weight of 8,000 to 200,000.

8. The photosensitive resin composition according to claim 1, wherein, when the composition contains the silane coupling agent (C), the amount thereof added is 1 to 20 parts by weight relative to 100 parts by weight of the total amount of the photosensitive resin.

9. The photosensitive resin composition according to claim 1, wherein the proportion of the monomer (d1) in the photopolymerizable unsaturated monomer (D) is 30 to 100 wt %.

10. The photosensitive resin composition according to claim 1, wherein the composition further comprises a monomer (d2) having 2 to 4 photopolymerizable unsaturated bonds per molecule.

11. The photosensitive resin composition according to claim 10, wherein, when the composition contains only the silane coupling agent (C as the photopolymerizable compound, the composition contains the monomer (d2).

12. The photosensitive resin composition according to claim 1, wherein, when the composition contains the photopolymerizable unsaturated monomer (D), the amount thereof added is 1 to 500 parts by weight relative to 100 parts by weight of the total amount of the photosensitive resin.

13. The photosensitive resin composition according to claim 11, wherein the amount of the monomer (d2) added is 1 to 500 parts by weight relative to 100 parts by weight of the total amount of the photosensitive resin.

14. The photosensitive resin composition according to claim 1, wherein the composition further comprises a photopolymerization initiator (E).

15. The photosensitive resin composition according to claim 14, wherein the photopolymerization initiator (E) is contained at 1 to 80 parts by weight relative to 100 parts by weight of the total amount of the photosensitive resin.

16. The photosensitive resin composition according to claim 1, wherein the polyamide resin (A) is obtained by reacting an acid component comprising an aromatic dicarboxylic acid or a reactive derivative thereof with a base component comprising an aromatic diamine represented by general formula (V):

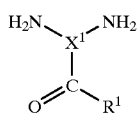

(V)

(in the formula, $X^1$ denotes a trivalent organic group having an aromatic ring, and $R^1$ denotes a monovalent organic group having a photosensitive group).

17. The photosensitive resin composition according to claim 1, wherein the polyamideimide resin (B) is obtained by reacting an acid component comprising an aromatic tricarboxylic acid anhydride or a reactive derivative thereof with a base component comprising an aromatic diamine represented by general formula (VI):

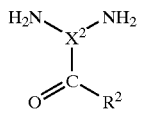

(VI)

(in the formula, $X^2$ denotes a trivalent organic group having an aromatic ring, and $R^2$ denotes a monovalent organic group having a photosensitive group).

18. A pattern production process comprising:
i) laminating to a substrate a photosensitive layer comprising the photosensitive resin composition according to claim 1;
ii) imagewise irradiating with actinic radiation so as to photocure an exposed area of the photosensitive layer; and
iii) selectively removing an unexposed area of the photosensitive layer by development so as to form a pattern.

19. An electronic component having a photosensitive layer comprising the photosensitive resin composition according to claim 1.

20. The photosensitive resin composition according to claim 2, wherein the polyamideimide resin (B) has in addition a repeating unit (U4) represented by general formula (IV):

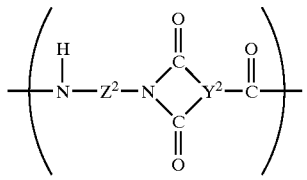

(IV)

(in the formula, $Y^2$ denotes a trivalent organic group having an aromatic ring, and $Z^2$ denotes a divalent organic group having an aromatic ring).

21. The photosensitive resin composition according to claim 20, wherein the repeating units (U2) and (U4) are contained at a molar ratio (U2):(U4) of 2:8 to 9:1.

22. The photosensitive resin composition according to claim 21, wherein the polyamideimide resin (B) has a weight average molecular weight of 8,000 to 200,000.

23. The photosensitive resin composition according to claim 3, wherein the polyamideimide resin (B) has a weight average molecular weight of 8,000 to 200,000.

24. The photosensitive resin composition according to claim 2, wherein the polyamide resin (A) has a weight average molecular weight of 8,000 to 200,000.

25. The photosensitive resin composition according to claim 20, wherein the composition further comprises a monomer (d2) having 2 to 4 photopolymerizable unsaturated bonds per molecule.

26. The photosensitive resin composition according to claim 2, wherein the composition further comprises a monomer (d2) having 2 to 4 photopolymerizable unsaturated bonds per molecule.

27. The photosensitive resin composition according to claim 3, wherein the composition further comprises a monomer (d2) having 2 to 4 photopolymerizable unsaturated bonds per molecule.

28. The photosensitive resin composition according to claim 20, wherein the composition further comprises a photopolymerization initiator E).

29. The photosensitive resin composition according to claim 2, wherein the composition further comprises a photopolymerization initiator (E).

30. The photosensitive resin composition according to claim 3, wherein the composition further comprises a photopolymerization initiator (E).

31. An electronic component having a photosensitive layer comprising the photosensitive resin composition according to claim 20.

32. An electronic component having a photosensitive layer comprising the photosensitive resin composition according to claim 2.

33. An electronic component having a photosensitive layer the photosensitive resin composition according to claim 3.

* * * * *